(12) United States Patent
Hirotsu et al.

(10) Patent No.: US 10,320,305 B2
(45) Date of Patent: Jun. 11, 2019

(54) TRANSFORMER

(71) Applicants: Sumitomo Electric Industries, Ltd., Osaka-shi (JP); NATIONAL UNIVERSITY CORPORATION TOYOHASHI UNIVERSITY OF TECHNOLOGY, Toyohashi-shi (JP)

(72) Inventors: Kenichi Hirotsu, Osaka (JP); Nobuo Shiga, Osaka (JP); Hideaki Nakahata, Osaka (JP); Takashi Ohira, Toyohashi (JP); Kyohei Yamada, Toyohashi (JP)

(73) Assignees: SUMITOMO ELECTRIC INDUSTRIES, LTD., Osaka-Shi (JP); NATIONAL UNIVERSITY CORPORATION TOYOHASHI OF TECHNOLOGY, Toyohashi-Shi (JP)

( * ) Notice: Subject to any disclaimer, the term of this patent is extended or adjusted under 35 U.S.C. 154(b) by 387 days.

(21) Appl. No.: 14/912,568

(22) PCT Filed: Aug. 8, 2014

(86) PCT No.: PCT/JP2014/070967
§ 371 (c)(1),
(2) Date: Feb. 17, 2016

(87) PCT Pub. No.: WO2015/029744
PCT Pub. Date: Mar. 5, 2015

(65) Prior Publication Data
US 2016/0211760 A1    Jul. 21, 2016

(30) Foreign Application Priority Data
Aug. 29, 2013  (JP) ................................ 2013-178494

(51) Int. Cl.
H01F 27/28    (2006.01)
H02M 5/06    (2006.01)
(Continued)

(52) U.S. Cl.
CPC .............. *H02M 5/06* (2013.01); *H02M 5/293* (2013.01); *H03H 7/38* (2013.01)

(58) Field of Classification Search
CPC .............. H01F 5/00; H01F 27/28; H02M 5/06
(Continued)

(56) References Cited

U.S. PATENT DOCUMENTS 4,635,005 A * 1/1987 Kaminsky ................. H03F 3/60
333/170

FOREIGN PATENT DOCUMENTS

EP    0412568 A2    2/1991
GB    755219 A *    8/1956  ............... H03H 7/38
(Continued)

OTHER PUBLICATIONS

Yamada et al., "Load-Invariant Constant-Voltage-Ratio Transformer without Employing Mutual Inductance," 2013 Nen Proceedings of the Society Conference of IEICE Tsushin (2) B-9-3, Sep. 3, 2013 (Sep. 3, 2013), p. 202.
(Continued)

*Primary Examiner* — Tszfung J Chan
(74) *Attorney, Agent, or Firm* — Baker Botts LLP; Michael A. Sartori

(57) ABSTRACT

A transformer is provided between a power supply, and a load with a resistance value R, and includes a two-terminal pair circuit composed of n-number of reactance elements that are mutually connected, where n is a natural number equal to or greater than 4. With respect to any value of the resistance value R of the load, an input impedance $Z_{in}$ of the two-terminal pair circuit has a real number component of $k \cdot R$, where k is a constant, and an imaginary number component of 0. Such a transformer has a small size and a light weight, and does not need a coil, an iron core, and the like as used in a conventional transformer.

8 Claims, 24 Drawing Sheets

(51) Int. Cl.
*H03H 7/38* (2006.01)
*H02M 5/293* (2006.01)

(58) Field of Classification Search
USPC .................................................. 336/200, 232
See application file for complete search history.

(56) References Cited

FOREIGN PATENT DOCUMENTS

| | | |
|---|---|---|
| GB | 0755219 A | 8/1956 |
| JP | H08-305450 A | 11/1996 |
| JP | 10-174436 A | 6/1998 |
| JP | 2002-049428 A | 2/2002 |
| JP | 2002-095241 A | 3/2002 |
| JP | 2002-272127 A | 9/2002 |

OTHER PUBLICATIONS

Homepage of Chuba Electric Power Co., Inc., [Pole Transformer], Internet <URL:http://www.chuden.co.jp/kids/kids_denki/home/hom_kaku/> corresponding to previous <URL:http://www.chuden.co.jp/e-museum/guide/3floor/exhibit_c23.html> [searched on Jul. 19, 2013].

Falcones et al., "Topology Comparison for Solid State Transformer Implementation," Power Energy Society General Meeting, 2010 IEEE, pp. 1-8, Minneapolis, Jul. 2010.

International Search Report in International Patent Application No. PCT/JP2014/070967, dated Nov. 4, 2014.

\* cited by examiner

T TYPE

π TYPE

TRANSFORMER

TECHNICAL FIELD

The present invention relates to a transformer.

BACKGROUND ART

In a commercial AC transmission and distribution system, a transformer is used. Just near a consumer's house, a pole transformer is used which transforms, for example, 6600 V (50 Hz or 60 Hz) to 200 V (see NON PATENT LITERATURE 1). Such a pole transformer has a thick coil as a conductive wire wound around an iron core, and therefore has a considerable weight. For example, a pole transformer with a diameter of 40 cm and a height of 80 cm has a weight of about 200 kg, including an insulating oil and a case.

On the other hand, for realizing a smart grid which is a next-generation power system, studies of an SST (Solid-State Transformer) are being conducted. For the SST, a high-frequency transformer is used (for example, see NON PATENT LITERATURE 2).

CITATION LIST

Non Patent Literature

NON PATENT LITERATURE 1: Homepage of Chubu Electric Power Co., Inc., [Pole Transformer], [online], [searched on Jul. 19, 2013], Internet <URL:http://www.chuden.co.jp/e-museum/guide/3floor/exhibit_c23.html>

NON PATENT LITERATURE 2: Falcones, S.: et al., Power and Energy Society General Meeting, 2010 IEEE, pp. 1-8, Minneapolis, July 2010

SUMMARY OF INVENTION

Technical Problem

A conventional pole transformer is heavy, and therefore is not easy to handle. In addition, an attachment space that is large enough to contain the outer dimension of the transformer is needed on the pole.

On the other hand, a high-frequency transformer cannot avoid an influence of a parasitic capacitance, and has a difficulty in designing.

Considering such conventional problems, an object of the present invention is to provide an innovative next-generation transformer with a small size and a light weight, which does not need a coil, an iron core, and the like for magnetic coupling, electromagnetic induction, or mutual inductance as used in a conventional transformer.

Solution to Problem

The present invention is a transformer provided between a power supply, and a load with a resistance value R, the transformer including a two-terminal pair circuit composed of n-number of reactance elements that are mutually connected, where n is a natural number equal to or greater than 4, wherein, with respect to any value of the resistance value R of the load, an input impedance $Z_{in}$ of the two-terminal pair circuit has a real number component of k·R, where k is a constant, and an imaginary number component of 0.

It is noted that a reactance element is an inductor having an inductive reactance or a capacitor having a capacitive reactance.

Advantageous Effects of Invention

Using the transformer of the present invention as a power transformer makes it unnecessary to use a conventional transformer including a coil, an iron core, and the like. Therefore, it becomes possible to realize drastic size reduction and weight reduction of a transformer, and thereby realize cost reduction.

DESCRIPTION OF EMBODIMENTS

Summary of Embodiments

Figure 1:
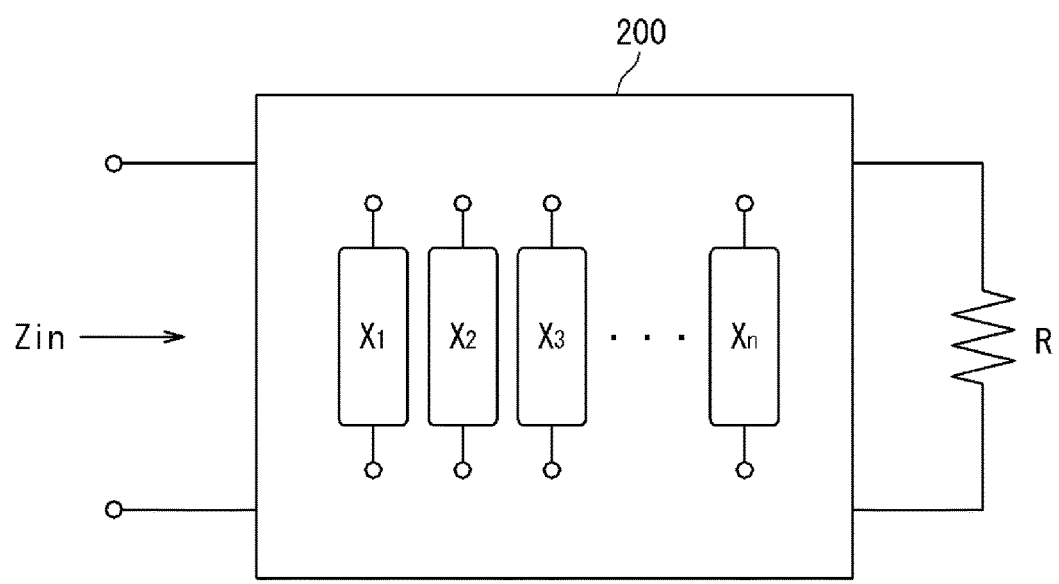
FIG. 1 is a diagram showing a concept of a transformer using a two-terminal pair circuit (four-terminal circuit).

Summary of embodiments of the present invention includes at least the following.

(1) A transformer is provided between a power supply, and a load with a resistance value R, and includes a two-terminal pair circuit composed of n-number of reactance elements that are mutually connected, where n is a natural number equal to or greater than 4. With respect to any value of the resistance value R of the load, an input impedance $Z_{in}$ of the two-terminal pair circuit has a real number component of k·R, where k is a constant, and an imaginary number component of 0.

The transformer as described above can obtain output voltage proportional to input voltage regardless of the resistance value R of the load. That is, the transformer that transforms input voltage to output voltage with a constant voltage transformation ratio $(1/k)^{1/2}$ can be obtained. Using the above transformer as transformers makes it unnecessary to use a conventional commercial-frequency transformer or high-frequency transformer. Therefore, drastic size reduction and weight reduction of a transformer can be realized, and as a result, cost reduction can be realized. Further, problems of parasitic capacitance and occurrence of magnetic field leakage, which arise in a high-frequency transformer, are also solved, and thus a transformer with low loss can be realized.

(2) In the transformer of (1), preferably, in the case where reactances of four reactance elements are $X_1$, $X_2$, $X_3$, and $X_4$, the two-terminal pair circuit is composed of, starting from an input side, $X_1$ present on one line of the two-terminal pair circuit, $X_2$ present between two lines thereof, $X_3$ present on the one line, and $X_4$ present between the two lines, and the following condition is satisfied.

$$(1/X_1)+(1/X_2)+(1/X_3)=0 \land X_2+X_3+X_4=0$$

In this case, the input impedance $Z_{in}$ is represented as $Z_{in}=(X_2^2/X_4^2)\cdot R$, and is proportional to the resistance value R of the load, and thus output voltage proportional to input voltage is obtained.

It is noted that the symbol "$\land$" denotes a logical conjunction or AND (hereafter, the same applies).

(3) In the transformer of (1), preferably, in the case where reactances of four reactance elements are $X_1$, $X_2$, $X_3$, and $X_4$, the two-terminal pair circuit is composed of, starting from an input side, $X_1$ present between two lines of the two-terminal pair circuit, $X_2$ present on one line thereof, $X_3$ present between the two lines, and $X_4$ present on the one line, and the following condition is satisfied.

$$X_1+X_2+X_3=0 \land (1/X_2)+(1/X_3)+(1/X_4)=0$$

In this case, the input impedance $Z_{in}$ is represented as $Z_{in}=(X_1^2/X_3^2)\cdot R$, and is proportional to the resistance value R of the load, and thus output voltage proportional to input voltage is obtained.

(4) In the transformer of (1), preferably, in the case where reactances of four reactance elements are $X_1$, $X_2$, $X_3$, and $X_4$, the two-terminal pair circuit is composed of: starting from an input side, a T-shaped circuit formed by $X_1$ present on one line of the two-terminal pair circuit, $X_2$ present between two lines thereof, and $X_3$ present on the one line; and $X_4$ present in parallel with a series unit of $X_1$ and $X_3$, and the following condition is satisfied.

$$X_1+X_3+X_4=0 \land (1/X_1)+(1/X_2)+(1/X_3)=0$$

In this case, the input impedance $Z_{in}$ is represented as $Z_{in}=(X_1^2/X_3^2)\cdot R$, and is proportional to the resistance value R of the load, and thus output voltage proportional to input voltage is obtained.

(5) In the transformer of (1), preferably, in the case where reactances of four reactance elements are $X_1$, $X_2$, $X_3$, and $X_4$, the two-terminal pair circuit is composed of, starting from an input side, a first series unit of $X_1$ and $X_2$ present between two lines of the two-terminal pair circuit, and a second series unit of $X_3$ and $X_4$ present between the two lines, such that a mutual connection point in the first series unit and a mutual connection point in the second series unit are output terminals, and the following condition is satisfied.

$$X_1+X_2+X_3+X_4=0 \land (1/X_1)+(1/X_2)+(1/X_3)+(1/X_4)=0$$

In this case, the input impedance $Z_{in}$ is represented as $Z_{in}=\{(X_1+X_2)^2/(X_1-X_2)^2\}\cdot R$, and is proportional to the resistance value R of the load, and thus output voltage proportional to input voltage is obtained.

(6) In the transformer of (1), preferably, in the case where reactances of five reactance elements are $X_A$, $X_B$, $X_C$, $X_D$, and $X_E$, the two-terminal pair circuit is composed of, starting from an input side, $X_A$ present on one line of the two-terminal pair circuit, $X_B$ present between two lines thereof, $X_C$ present on the one line, $X_D$ present between the two lines, and $X_E$ present on the one line, and the following relationship is satisfied.

$$X_A=-X_B \land X_E=-X_D \land X_C=X_A+X_E$$

In this case, the input impedance $Z_{in}$ is represented as $Z_{in}=(X_A^2/X_E^2)\cdot R$, and is proportional to the resistance value R of the load, and thus output voltage proportional to input voltage is obtained.

(7) In the transformer of (1), preferably, in the case where reactances of five reactance elements are $X_A$, $X_B$, $X_C$, $X_D$, and $X_E$, the two-terminal pair circuit is composed of, starting from an input side, $X_A$ present between two lines of the two-terminal pair circuit, $X_B$ present on one line thereof, $X_C$ present between the two lines, $X_D$ present on the one line, and $X_E$ present between the two lines, and the following relationship is satisfied.

$$X_A=-X_B \land X_E=-X_D \land X_C=X_A\cdot X_E/(X_A+X_E)$$

In this case, the input impedance $Z_{in}$ is represented as $Z_{in}=(X_A^2/X_E^2)\cdot R$, and is proportional to the resistance value R of the load, and thus output voltage proportional to input voltage is obtained.

(8) In the transformer of (1), preferably, in the case where reactances of six reactance elements are $X_A$, $X_B$, $X_C$, $X_D$, $X_E$, and $X_F$, the two-terminal pair circuit is composed of, starting from an input side, $X_A$ present on one line of the two-terminal pair circuit, $X_B$ present between two lines thereof, $X_C$ present on the one line, $X_D$ present between the two lines, $X_E$ present on the one line, and $X_F$ present between the two lines, and the following relationship is satisfied.

$$X_A=X_C=-X_B \land X_D=X_F=-X_E$$

In this case, the input impedance $Z_{in}$ is represented as $Z_{in}=(X_A^2/X_F^2)\cdot R$, and is proportional to the resistance value R of the load, and thus output voltage proportional to input voltage is obtained.

(9) In the transformer of (1), preferably, in the case where reactances of six reactance elements are $X_A$, $X_B$, $X_C$, $X_D$, $X_E$, and $X_F$, the two-terminal pair circuit is composed of, starting from an input side, $X_A$ present between two lines of the two-terminal pair circuit, $X_B$ present on one line thereof, $X_C$ present between the two lines, $X_D$ present on the one line, $X_E$ present between the two lines, and $X_F$ present on the one line, and the following relationship is satisfied.

$$X_A=X_C=-X_B \wedge X_D=X_F=-X_E$$

In this case, the input impedance $Z_{in}$ is represented as $Z_{in}=(X_A^2/X_F^2)\cdot R$, and is proportional to the resistance value R of the load, and thus output voltage proportional to input voltage is obtained.

(10) A transformer may include: a circuit configured to perform switching; and the transformer of any one of (1) to (9), which is interposed in the circuit.

In this case, it is possible to utilize a transformer having a lumped constant circuit, using an environment in which switching is performed.

(11) In the transformer of any one of (1) to (9), a capacitance of a cable and an inductance of a cable may be used as the reactance elements.

In this case, the cable can easily ensure voltage withstanding performance and the cost thereof is low.

(12) In the transformer of (10), preferably, a frequency of the switching is at least 1 MHz.

In this case, it is possible to utilize a transformer having a lumped constant circuit, using an environment in which switching is performed at a high frequency.

Details of Embodiments

<Transformer Using Lumped Constant Circuit>

Next, the details of a transformer using a lumped constant circuit according to embodiments of the present invention will be described.

<<Outline>>

FIG. 1 is a diagram showing a concept of a transformer 200 using a two-terminal pair circuit (four-terminal circuit). For functioning as a transformer, an input impedance $Z_{in}$ and a load R (resistance value R) need to satisfy the following relationship.

$$Z_{in}=k\cdot R (k \text{ is a constant})$$

Thus, the input impedance $Z_{in}$ linearly varies with respect to load variation, and the voltage transformation ratio is constant. In addition, the input impedance $Z_{in}$ does not have a reactance component. That is, the input impedance $Z_{in}$ needs to have a real number component of $k\cdot R$ and an imaginary number component of 0. The transformer 200 having such an input impedance $Z_{in}$ is referred to as an LILT (Load-Invariant Linear Transformer).

The transformer 200 as described above can obtain output voltage proportional to input voltage regardless of the resistance value R of the load. That is, the transformer 200 that transforms input voltage to output voltage with a constant voltage transformation ratio $(1/k)^{1/2}$ can be obtained. Using such a transformer 200 as transformers makes it unnecessary to use a conventional commercial-frequency transformer or high-frequency transformer. Therefore, drastic size reduction and weight reduction of a transformer can be realized, and as a result, cost reduction can be realized. Further, problems of parasitic capacitance and occurrence of magnetic field leakage, which arise in a high-frequency transformer, are also solved, and thus a transformer with low loss can be realized.

Although an infinite number of circuit configurations as an LILT are conceivable, it is desirable that an element number n of reactance elements is small. The present inventors have performed full search while changing the value of n to 1, 2, 3, 4, . . . , starting from 1, and as a result, have found that the minimum element number n is 4.

Figure 2:
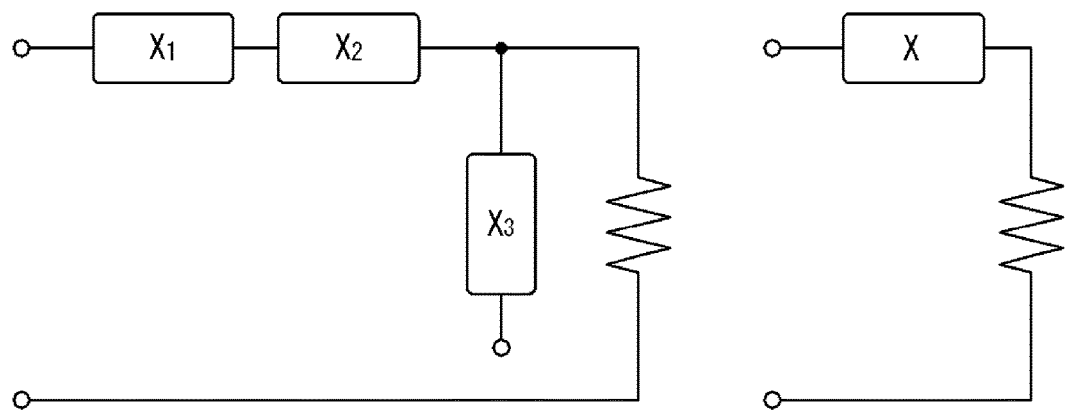
FIG. 2 is a diagram showing a concept of the element number of elements composing a circuit.

FIG. 2 is a diagram showing an example of a concept of the element number n of elements composing a circuit. In FIG. 2, the left circuit apparently includes three elements $X_1$, $X_2$, and $X_3$. However, $X_1$ and $X_2$ which are topologically equivalent to each other are counted as one element, and $X_3$ which has no significance in terms of electric circuit is not counted. Therefore, the left circuit configuration is the same as the right circuit configuration, and the element number n is 1.

Figure 3:
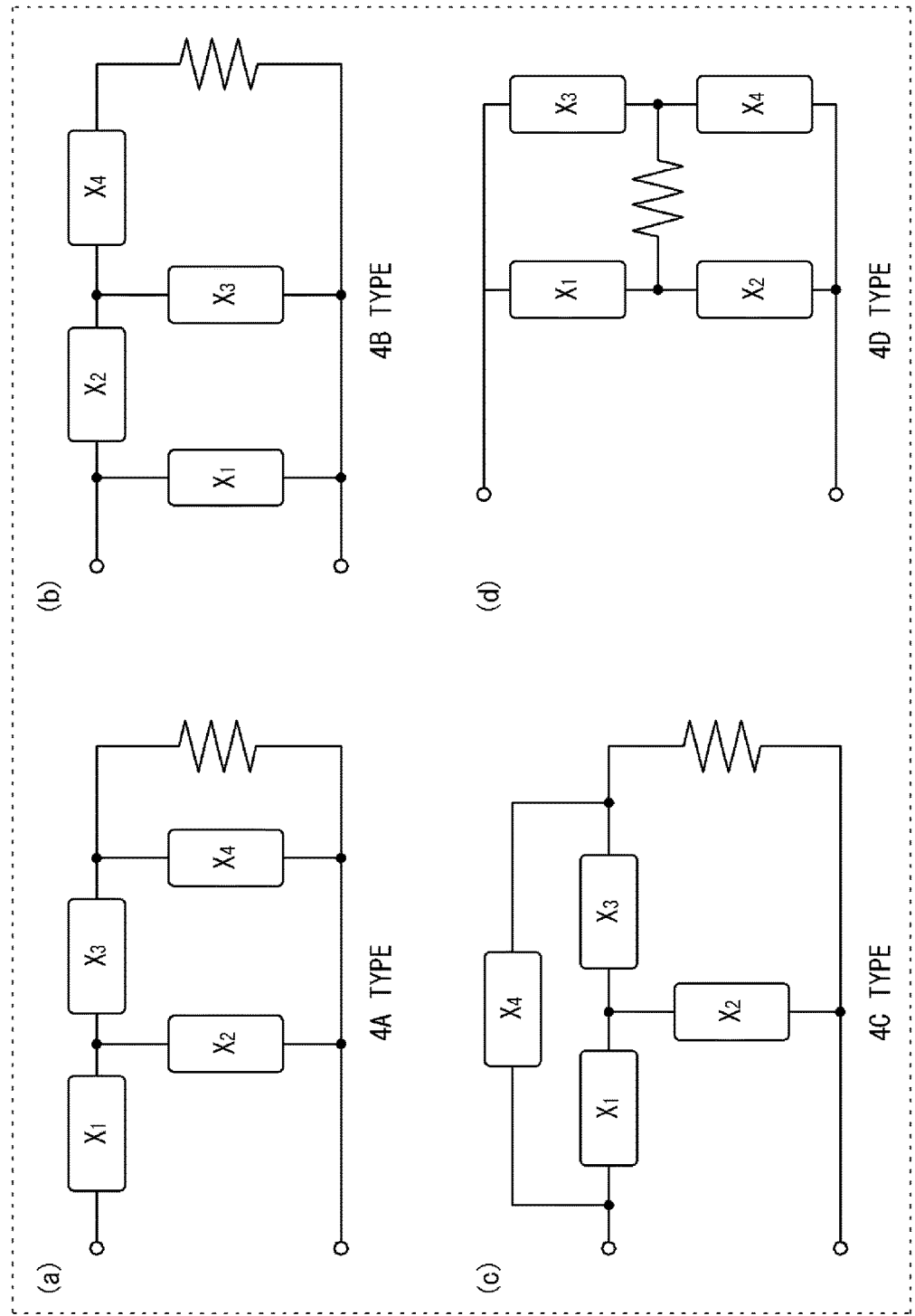
FIG. 3 is a diagram showing four patterns of circuit configurations that can be made by using the minimum element number 4.

FIG. 3 is a diagram showing four patterns of circuit configurations that can be made by using the minimum element number 4, in which circuit configurations of (a), (b), (c), and (d) are referred to as "4A type", "4B type", "4C type", and "4D type", respectively.

First Embodiment: 4A Type

Figure 4:
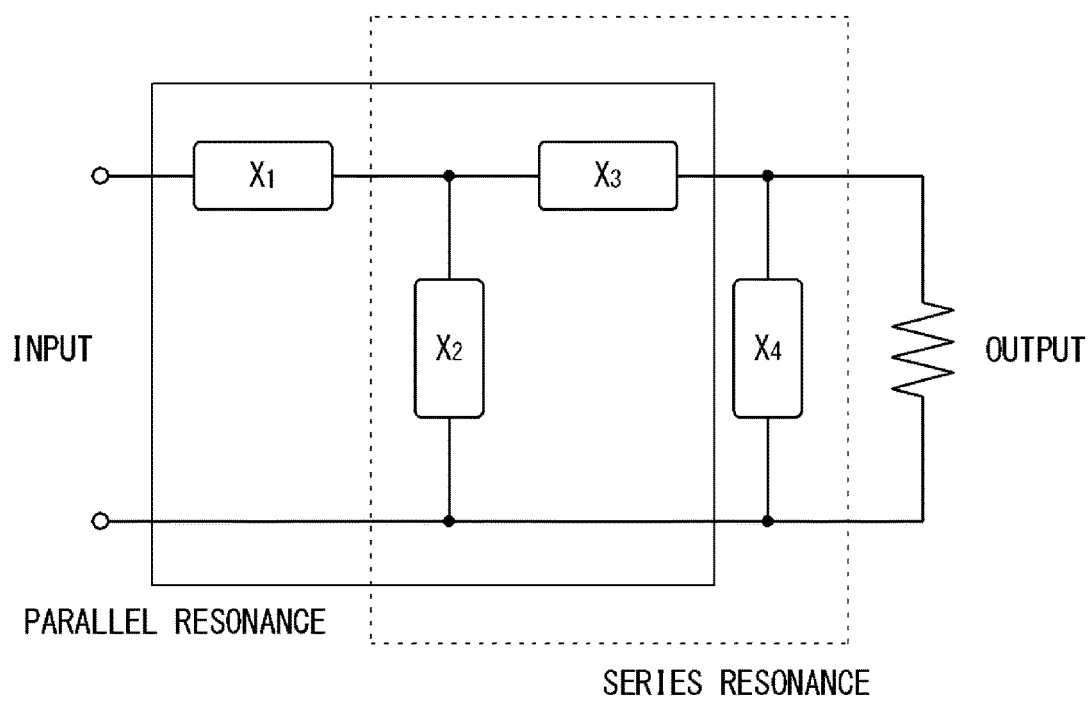
FIG. 4 is a diagram showing a circuit configuration of 4A type.

FIG. 4 is a diagram showing the circuit configuration of 4A type. To describe in words, for example, in the case where reactances of the four reactance elements are $X_1$, $X_2$, $X_3$, and $X_4$, a two-terminal pair circuit is composed of, starting from the input side, $X_1$ present on one line of the two-terminal pair circuit, $X_2$ present between two lines thereof, $X_3$ present on the one line, and $X_4$ present between the two lines. In this case, the input impedance $Z_{in}$ is represented as the upper part of the following expression. In addition, in the case of setting a condition for causing the imaginary number component to be 0 by parallel resonance and series resonance, the input impedance $Z_{in}$ is represented as the lower part.

In the following expression, "j" denotes an imaginary number $(-1)^{1/2}$.

$$Z_{in} = \frac{R\{X_1(X_2+X_3+X_4)+X_2(X_3+X_4)+jX_4(X_1X_2+X_2X_3+X_3X_1)\}}{X_4(X_2+X_3)-jR(X_2+X_3+X_4)}$$

$$= \frac{X_2^2}{X_4^2}R, \left(\frac{1}{X_1}+\frac{1}{X_2}+\frac{1}{X_3}=0 \wedge X_2+X_3+X_4=0\right)$$

That is, when the parameter condition satisfies $(1/X_1)+(1/X_2)+(1/X_3)=0 \wedge X_2+X_3+X_4=0$, in other words, when $(1/X_1)+(1/X_2)+(1/X_3)=0$ and $X_2+X_3+X_4=0$ are satisfied, $Z_{in}=(X_2^2/X_4^2)\cdot R$ is satisfied, and thus output voltage proportional to input voltage is obtained. It is noted that, in order to exert this function, the input voltage needs to be AC.

Figure 5:
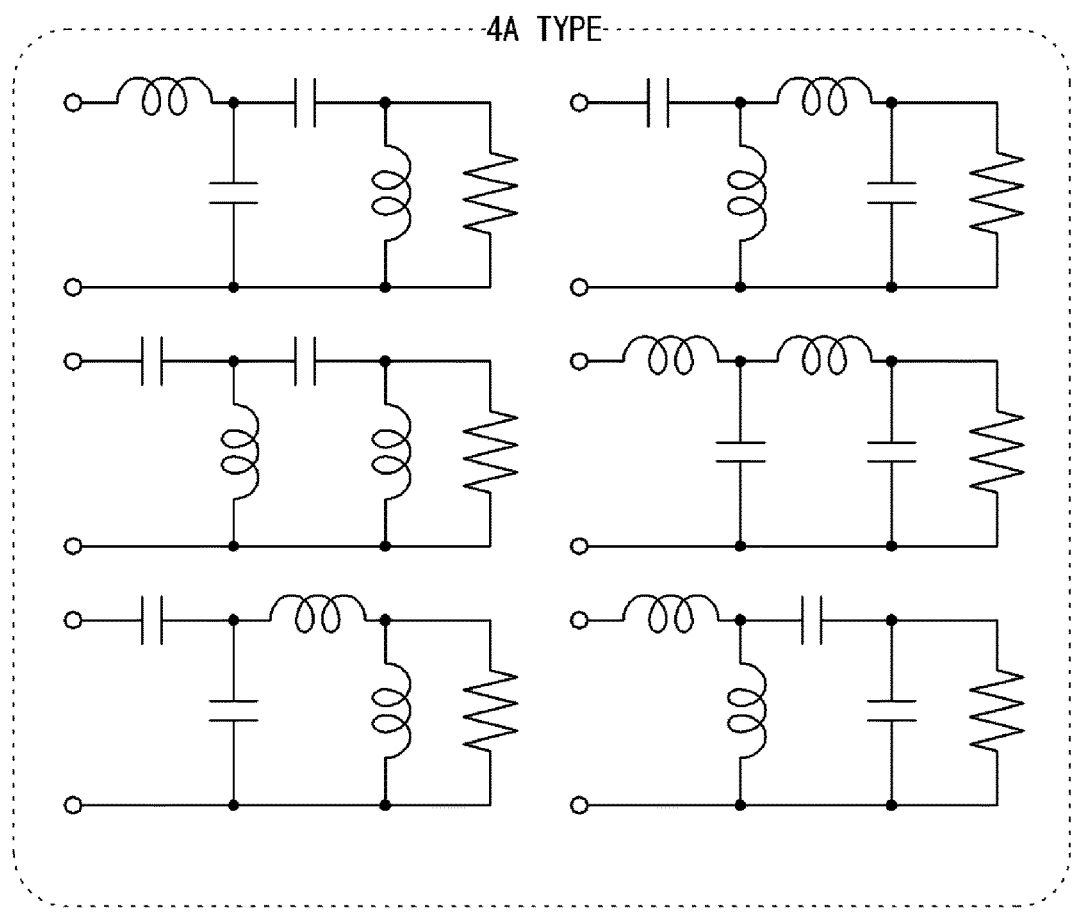
FIG. 5 is a diagram showing six patterns as actual examples of the circuit configuration of 4A type.

FIG. 5 is a diagram showing six patterns as actual examples of the circuit configuration of 4A type.

Second Embodiment: 4B Type

Figure 6:
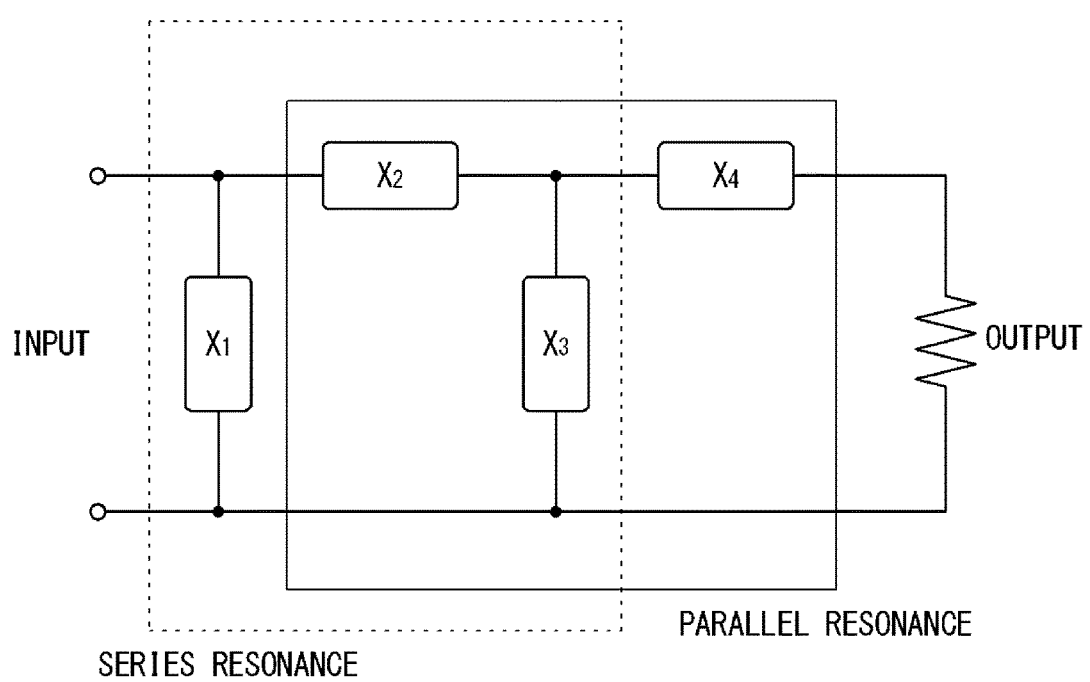
FIG. 6 is a diagram showing a circuit configuration of 4B type.

FIG. 6 is a diagram showing the circuit configuration of 4B type. To describe in words, for example, in the case where reactances of the four reactance elements are $X_1$, $X_2$, $X_3$, and $X_4$, a two-terminal pair circuit is composed of, starting from the input side, $X_1$ present between two lines of the two-terminal pair circuit, $X_2$ present on one line thereof, $X_3$ present between the two lines, and $X_4$ present on the one line. In this case, the input impedance $Z_{in}$ is represented as the upper part of the following expression. In addition, in the case of setting a condition for causing the imaginary number component to be 0 by parallel resonance and series resonance, the input impedance $Z_{in}$ is represented as the lower part.

$$Z_{in} = \frac{RX_1(X_2 + X_3) + jX_1(X_2X_3 + X_3X_4 + X_4X_2)}{X_3(X_1 + X_2) + X_4(X_1 + X_2 + X_3) - jR(X_1 + X_2 + X_3)}$$
$$= \frac{X_1^2}{X_3^2} R, \left(X_1 + X_2 + X_3 = 0 \wedge \frac{1}{X_2} + \frac{1}{X_3} + \frac{1}{X_4} = 0\right)$$

That is, when the parameter condition satisfies $X_1+X_2+X_3=0 \wedge (1/X_2)+(1/X_3)+(1/X_4)=0$, $Z_{in}=(X_1^2/X_3^2)\cdot R$ is satisfied, and thus output voltage proportional to input voltage is obtained. It is noted that, in order to exert this function, the input voltage needs to be AC.

Figure 7:
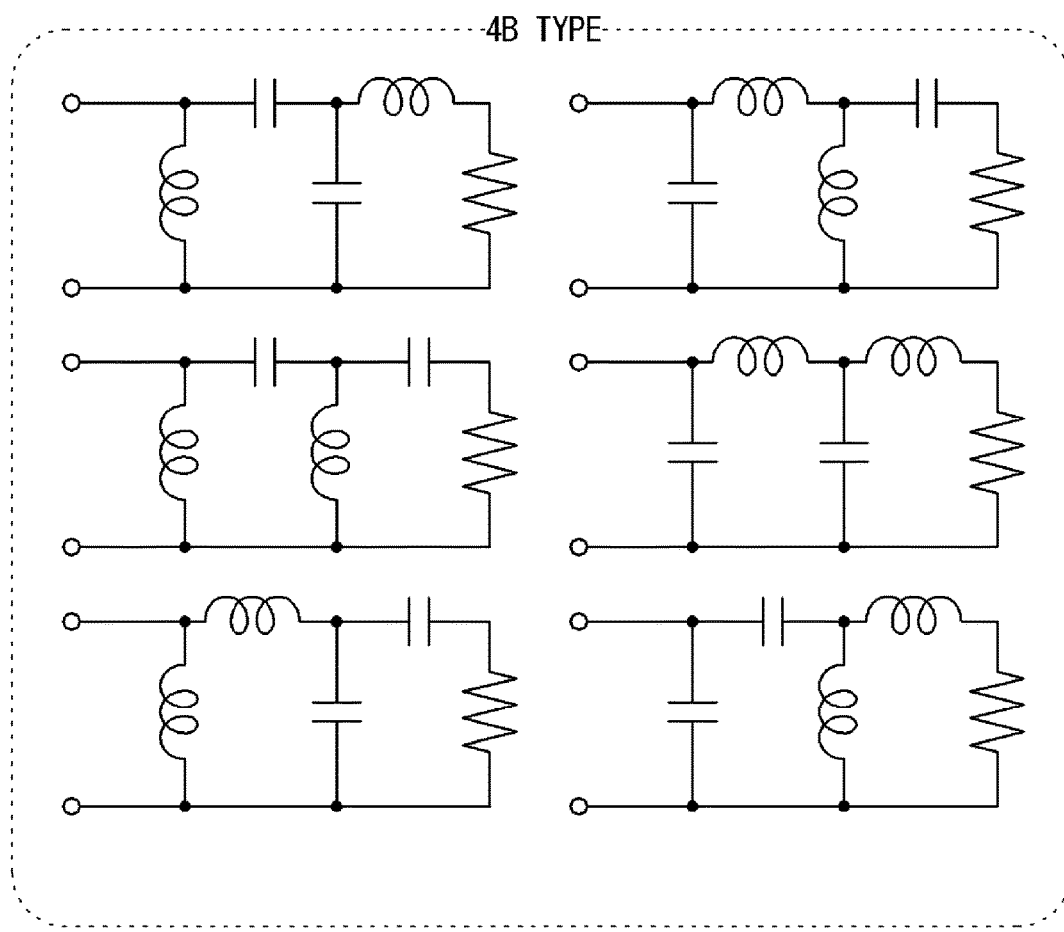
FIG. 7 is a diagram showing six patterns as actual examples of the circuit configuration of 4B type.

FIG. 7 is a diagram showing six patterns as actual examples of the circuit configuration of 4B type.

Third Embodiment: 4C Type

Figure 8:
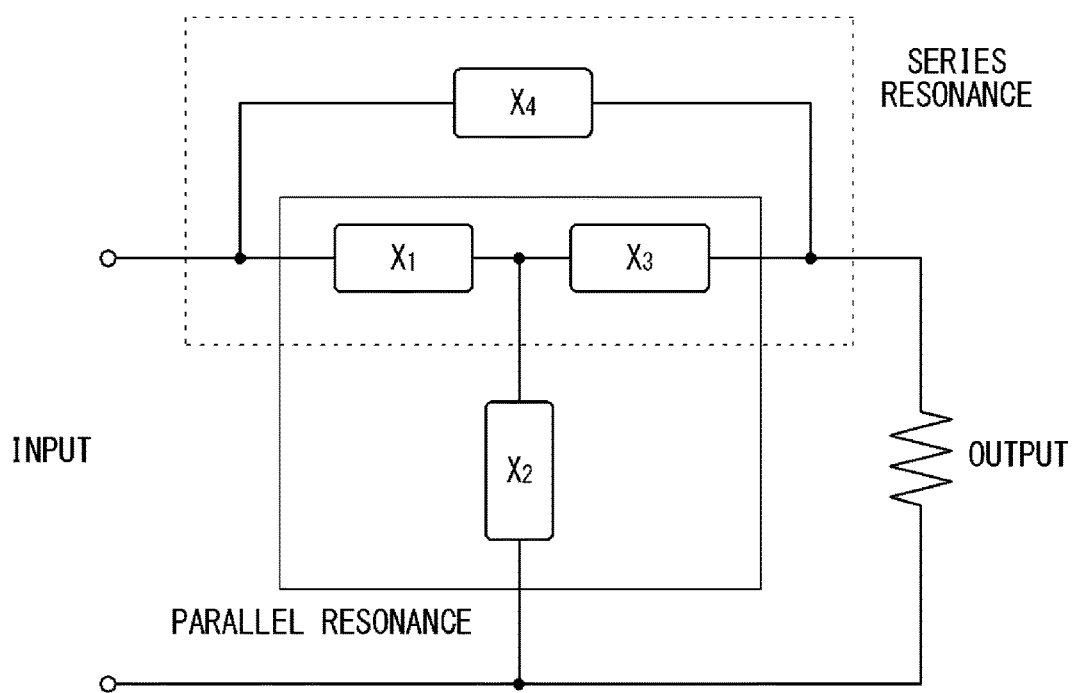
FIG. 8 is a diagram showing a circuit configuration of 4C type.

FIG. 8 is a diagram showing the circuit configuration of 4C type. To describe in words, for example, in the case where reactances of the four reactance elements are $X_1$, $X_2$, $X_3$, and $X_4$, a two-terminal pair circuit is composed of: starting from the input side, a T-shaped circuit formed by $X_1$ present on one line of the two-terminal pair circuit, $X_2$ present between two lines thereof, and $X_3$ present on the one line; and $X_4$ present in parallel with a series unit of $X_1$ and $X_3$. In this case, the input impedance $Z_{in}$ is represented as the upper part of the following expression. In addition, in the case of setting a condition for causing the imaginary number component to be 0 by parallel resonance and series resonance, the input impedance $Z_{in}$ is represented as the lower part.

$$Z_{in} = \frac{-X_4(X_1X_2 + X_2X_3 + X_3X_1) + jR\{X_1(X_3 + X_4) + X_2(X_1 + X_3 + X_4)\}}{R(X_1 + X_3 + X_4) + j\{X_2(X_1 + X_3 + X_4) + X_3(X_1 + X_4)\}}$$
$$= \frac{X_1^2}{X_3^2} R, \left(X_1 + X_3 + X_4 = 0 \wedge \frac{1}{X_1} + \frac{1}{X_2} + \frac{1}{X_3} = 0\right)$$

That is, when the parameter condition satisfies $X_1+X_3+X_4=0 \wedge (1/X_1)+(1/X_2)+(1/X_3)=0$, $Z_{in}=(X_1^2/X_3^2)\cdot R$ is satisfied, and thus output voltage proportional to input voltage is obtained. It is noted that, in order to exert this function, the input voltage needs to be AC.

Figure 9:
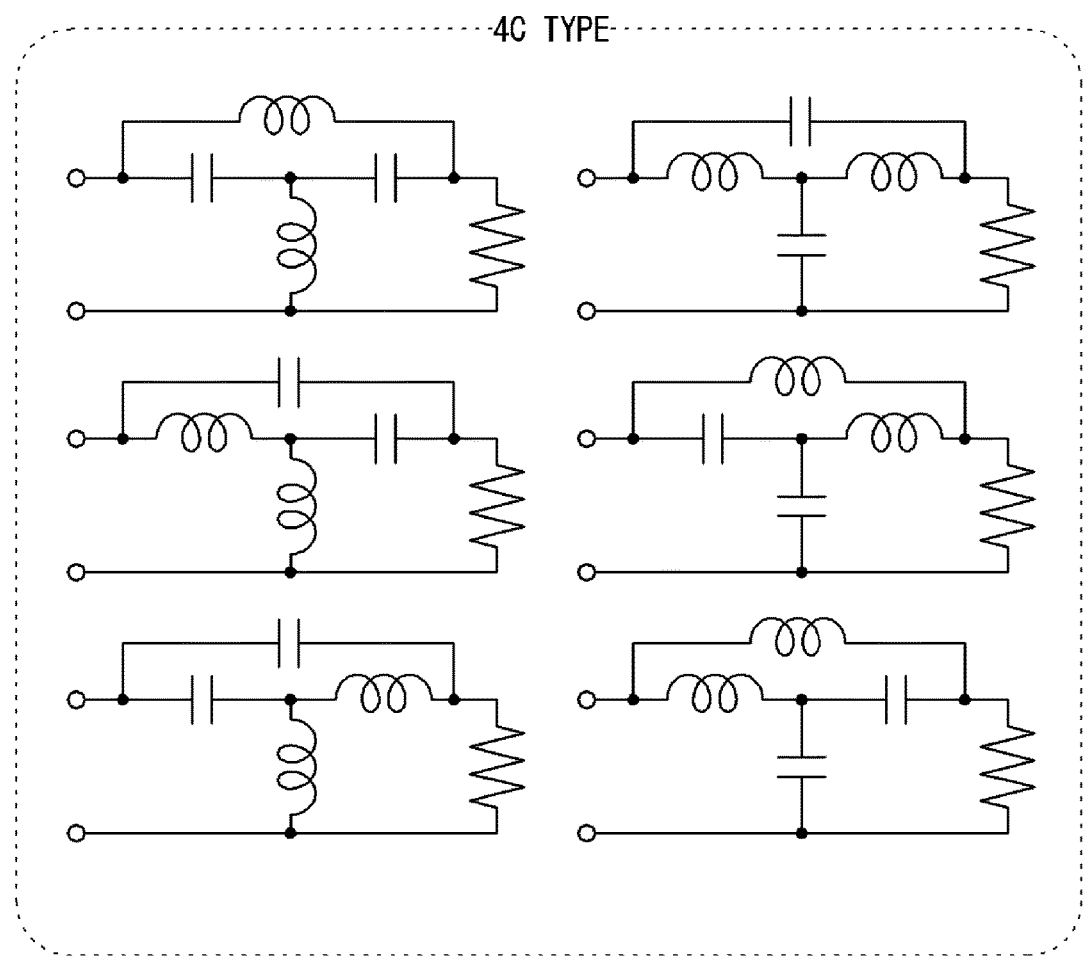
FIG. 9 is a diagram showing six patterns as actual examples of the circuit configuration of 4C type.

FIG. 9 is a diagram showing six patterns as actual examples of the circuit configuration of 4C type.

Fourth Embodiment: 4D Type

Figure 10:
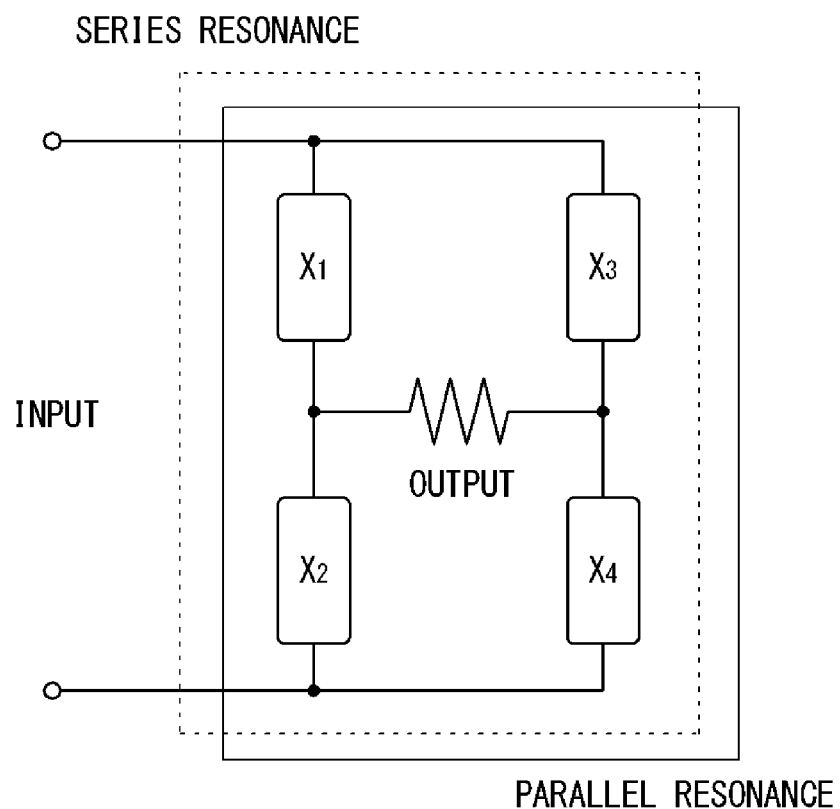
FIG. 10 is a diagram showing a circuit configuration of 4D type.

FIG. 10 is a diagram showing the circuit configuration of 4D type. To describe in words, for example, in the case where reactances of the four reactance elements are $X_1$, $X_2$, $X_3$, and $X_4$, a two-terminal pair circuit is composed of, starting from the input side, a first series unit of $X_1$ and $X_2$ present between two lines of the two-terminal pair circuit, and a second series unit of $X_3$ and $X_4$ present between the two lines, such that a mutual connection point in the first series unit and a mutual connection point in the second series unit are output terminals. In this case, the input impedance $Z_{in}$ is represented as the upper part of the following expression. In addition, in the case of setting a condition for causing the imaginary number component to be 0 by parallel resonance and series resonance, the input impedance $Z_{in}$ is represented as the lower part.

$$Z_{in} = \frac{-X_1X_2(X_3 + X_4) - X_3X_4(X_1 + X_2) + jR(X_1 + X_2)(X_3 + X_4)}{R(X_1 + X_2 + X_3 + X_4) + j(X_1 + X_3)(X_2 + X_4)\}}$$
$$= \frac{(X_1 + X_2)^2}{(X_1 - X_2)^2} R, \left(X_1 + X_2 + X_3 + X_4 = 0 \wedge \frac{1}{X_1} + \frac{1}{X_2} + \frac{1}{X_3} + \frac{1}{X_4} = 0\right)$$

That is, when the parameter condition satisfies $X_1+X_2+X_3+X_4=0 \wedge (1/X_1)+(1/X_2)+(1/X_3)+(1/X_4)=0$, $Z_{in}=\{(X_1+X_2)^2/(X_1-X_2)^2\}\cdot R$ is satisfied, and thus output voltage proportional to input voltage is obtained. It is noted that, in order to exert this function, the input voltage needs to be AC.

Figure 11:
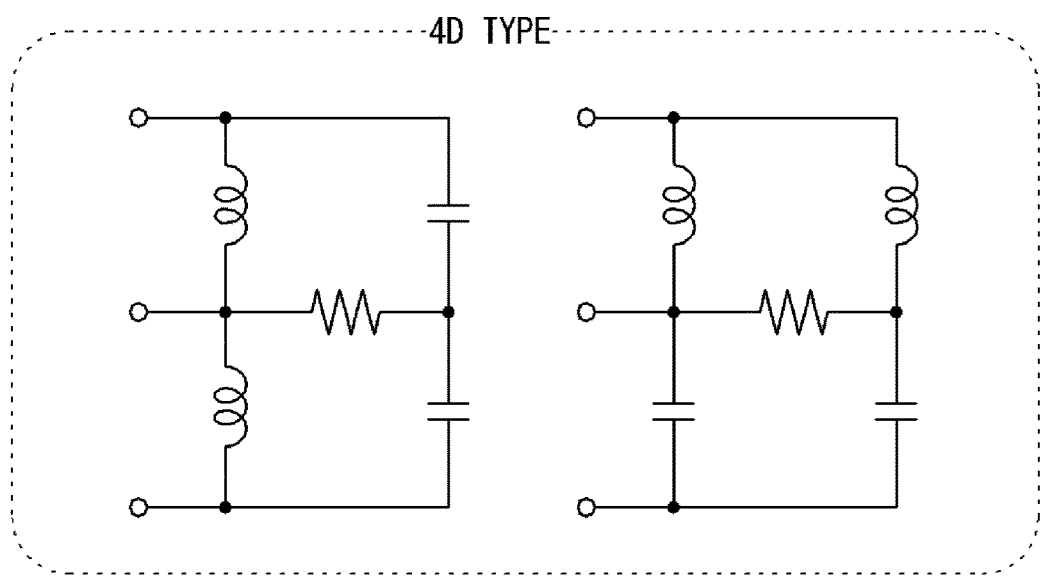
FIG. 11 is a diagram showing two patterns as actual examples of the circuit configuration of 4D type.

FIG. 11 is a diagram showing two patterns as actual examples of the circuit configuration of 4D type.

Fifth Embodiment: n=5 (Application of T Type)

Next, the circuit configuration with the element number n=5 will be described. Although the element number increases by one from the case of n=4, this circuit configuration is practical.

Figure 12:
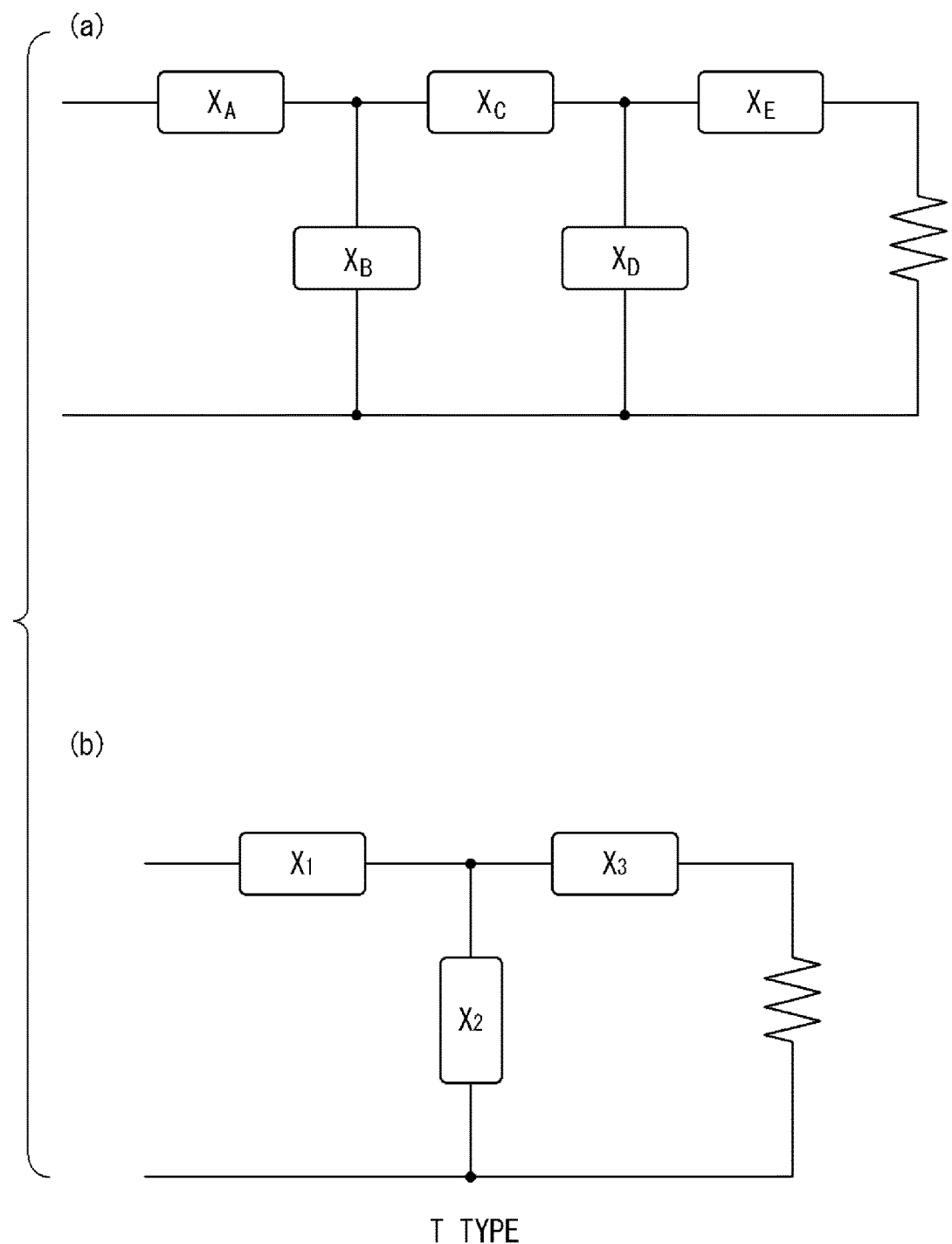
FIG. 12 is a circuit diagram in which (a) shows a first example of circuit configuration with n=5, and (b) shows a T-shaped circuit.

In FIG. 12, (a) is a diagram showing a first example of circuit configuration with n=5. To describe in words, in the case where reactances of the five reactance elements are $X_A$, $X_B$, $X_C$, $X_D$, and $X_E$, a two-terminal pair circuit is composed of, starting from the input side, $X_A$ present on one line of the two-terminal pair circuit, $X_B$ present between two lines thereof, $X_C$ present on the one line, $X_D$ present between the two lines, and $X_E$ present on the one line.

On the other hand, in FIG. 12, (b) shows a T-shaped circuit. In this T-shaped circuit, the input impedance $Z_{in}$ is represented as the upper part of the following expression, and in order to cause the imaginary number component to be 0, a parameter condition shown as the lower part needs to be satisfied.

$$Z_{in} = \frac{-(X_1X_2 + X_2X_3 + X_3X_1) + jR(X_1 + X_2)}{R + j(X_2 + X_3)}$$
$$= \frac{X_1^2}{R}, (X_1 = X_3 = -X_2)$$

In the case of T-shaped circuit, since R is present in the denominator, an LILT is not obtained. However, if the T-shaped circuit is configured in a two-stage form, $Z_{in}=k\cdot R$ is satisfied, and thus output voltage proportional to input voltage is obtained. Considering this, in the case where reactances of the five reactance elements in the circuit shown in (a) of FIG. 12 are $X_A$, $X_B$, $X_C$, $X_D$, and $X_E$, the two-terminal pair circuit composed of, starting from the input side, $X_A$ present on one line of the two-terminal pair circuit, $X_B$ present between two lines thereof, $X_C$ present on the one line, $X_D$ present between the two lines, and $X_E$ present on the one line, is set to satisfy the following relationship.

$$X_A = -X_B \wedge X_E = -X_D \wedge X_C = X_A + X_E$$

In this case, the input impedance $Z_{in}$ is represented as $Z_{in} = (X_A^2/X_E^2) \cdot R$, and is proportional to the resistance value R of the load, and thus output voltage proportional to input voltage is obtained. It is noted that, in order to exert this function, the input voltage needs to be AC.

Sixth Embodiment: n=5 (Application of π Type)

Figure 13:
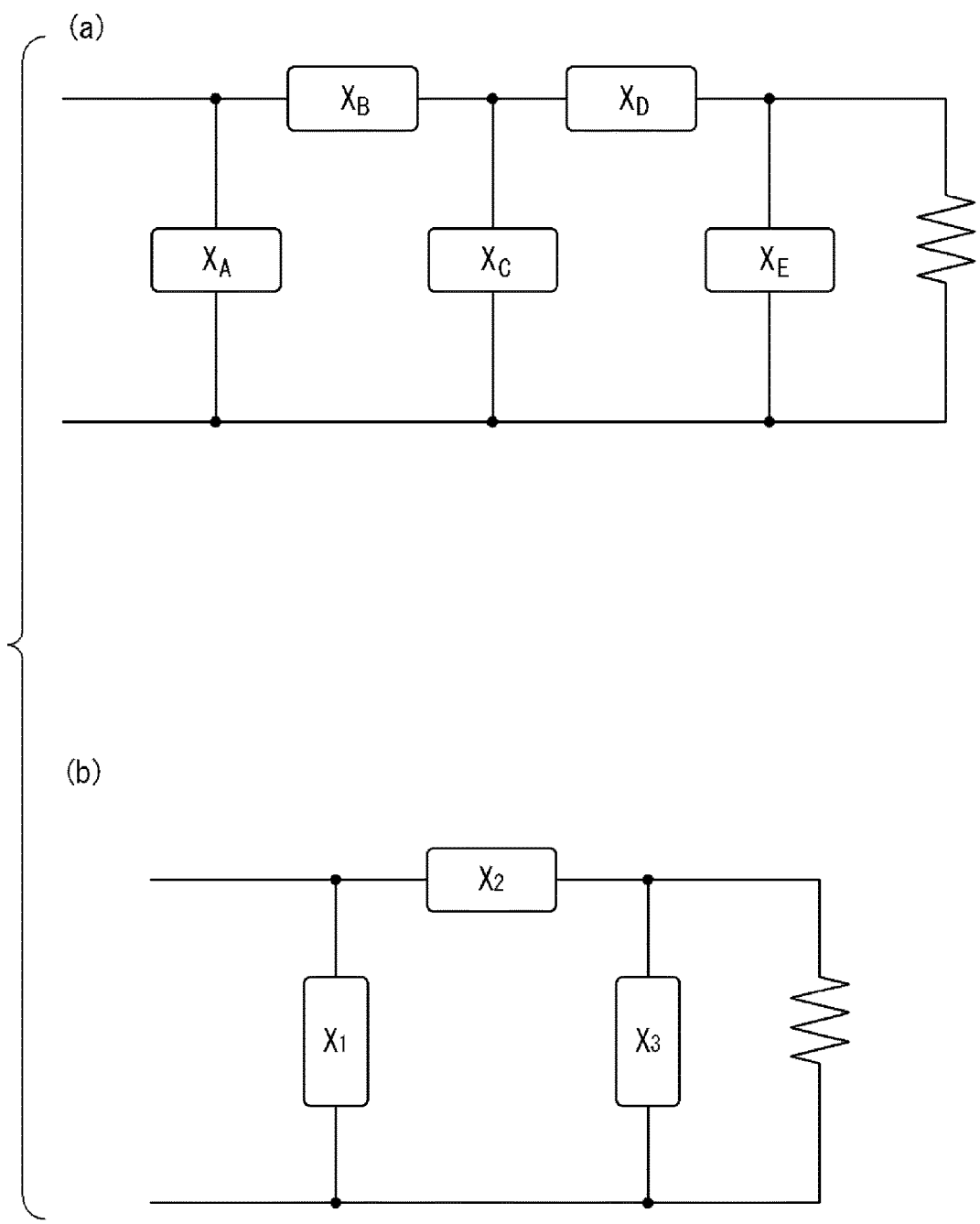
FIG. 13 is a circuit diagram in which (a) shows a second example of circuit configuration with n=5, and (b) shows a i-shaped circuit.

In FIG. 13, (a) is a diagram showing a second example of circuit configuration with n=5. To describe in words, in the case where reactances of the five reactance elements are $X_A$, $X_B$, $X_C$, $X_D$, and $X_E$, a two-terminal pair circuit is composed of, starting from the input side, $X_A$ present between two lines of the two-terminal pair circuit, $X_B$ present on one line thereof, $X_C$ present between the two lines, $X_D$ present on the one line, and $X_E$ present between the two lines.

On the other hand, in FIG. 13, (b) shows a π-shaped circuit. In this π-shaped circuit, the input impedance $Z_{in}$ is represented as the upper part of the following expression, and in order to cause the imaginary number component to be 0, a parameter condition shown as the lower part needs to be satisfied.

$$Z_{in} = \frac{RX_1(X_2 + X_3) + jX_1X_2X_3}{X_3(X_1 + X_2) - jR(X_1 + X_2 + X_3)}$$
$$= \frac{X_1^2}{R}, (X_1 = X_3 = -X_2)$$

In the case of π-shaped circuit, since R is present in the denominator, an LILT is not obtained. However, if the π-shaped circuit is configured in a two-stage form, $Z_{in} = k \cdot R$ is satisfied, and thus output voltage proportional to input voltage is obtained. Considering this, in the case where reactances of the five reactance elements in the circuit shown in (a) of FIG. 13 are $X_A$, $X_B$, $X_C$, $X_D$, and $X_E$, the two-terminal pair circuit composed of, starting from the input side, $X_A$ present between two lines of the two-terminal pair circuit, $X_B$ present on one line thereof, $X_C$ present between the two lines, $X_D$ present on the one line, and $X_E$ present between the two lines, is set to satisfy the following relationship.

$$X_A = -X_B \wedge X_E = -X_D \wedge X_C = X_A \cdot X_E/(X_A + X_E)$$

In this case, the input impedance $Z_{in}$ is represented as $Z_{in} = (X_A^2/X_E^2) \cdot R$, and is proportional to the resistance value R of the load, and thus output voltage proportional to input voltage is obtained. It is noted that, in order to exert this function, the input voltage needs to be AC.

Seventh Embodiment: n=6 (T at Preceding Stage and π at Subsequent Stage)

Next, the circuit configuration with the element number n=6 will be described. Although the element number increases by two from the case of n=4, this circuit configuration is practical.

Figure 14:
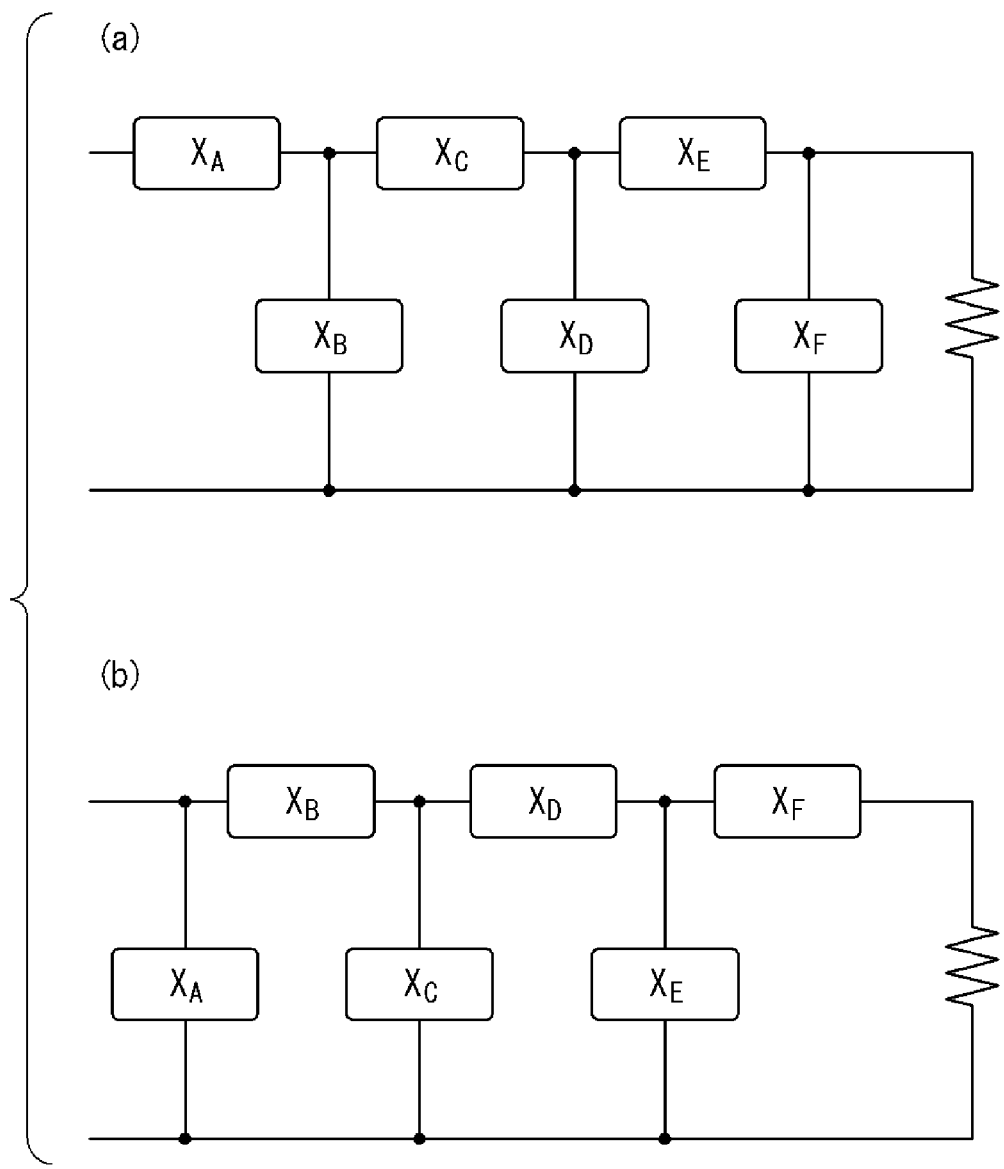
FIG. 14 is a circuit diagram in which (a) shows a first example of circuit configuration with n=6, and (b) shows a second example of circuit configuration with n=6.

In FIG. 14, (a) is a diagram showing a first example of circuit configuration with n=6. To describe in words, in the case where reactances of the six reactance elements are $X_A$, $X_B$, $X_C$, $X_D$, $X_E$, and $X_F$, a two-terminal pair circuit is composed of, starting from the input side, $X_A$ present on one line of the two-terminal pair circuit, $X_B$ present between two lines thereof, $X_C$ present on the one line, $X_D$ present between the two lines, $X_E$ present on the one line, and $X_F$ present between the two lines.

As described above, in either case of T-shaped circuit or π-shaped circuit, since R is present in the denominator, an LILT is not obtained. However, if the T-shaped circuit and the π-shaped circuit are combined, $Z_{in} = k \cdot R$ is satisfied, and thus output voltage proportional to input voltage is obtained. Considering this, in the case where reactances of the six reactance elements in the circuit shown in (a) of FIG. 14 are $X_A$, $X_B$, $X_C$, $X_D$, $X_E$, and $X_F$, the two-terminal pair circuit composed of, starting from the input side, $X_A$ present on one line of the two-terminal pair circuit, $X_B$ present between two lines thereof, $X_C$ present on the one line, $X_D$ present between the two lines, $X_E$ present on the one line, and $X_F$ present between the two lines, is set to satisfy the following relationship.

$$X_A = X_C = -X_B \wedge X_D = X_F = -X_E$$

In this case, the input impedance $Z_{in}$ is represented as $Z_{in} = (X_A^2/X_E^2) \cdot R$, and is proportional to the resistance value R of the load, and thus output voltage proportional to input voltage is obtained. It is noted that, in order to exert this function, the input voltage needs to be AC.

Eighth Embodiment: n=6 (π at Preceding Stage and T at Subsequent Stage)

In FIG. 14, (b) is a diagram showing a second example of circuit configuration with n=6. To describe in words, in the case where reactances of the six reactance elements are $X_A$, $X_B$, $X_C$, $X_D$, $X_E$, and $X_F$, a two-terminal pair circuit is composed of, starting from the input side, $X_A$ present between two lines of the two-terminal pair circuit, $X_B$ present on one line thereof, $X_C$ present between the two lines, $X_D$ present on the one line, $X_E$ present between the two lines, and $X_F$ present on the one line.

As described above, in either case of π-shaped circuit or T-shaped circuit, since R is present in the denominator, an LILT is not obtained. However, if the π-shaped circuit and the T-shaped circuit are combined, $Z_{in} = k \cdot R$ is satisfied, and thus output voltage proportional to input voltage is obtained. Considering this, in the case where reactances of the six reactance elements in the circuit shown in (b) of FIG. 14 are $X_A$, $X_B$, $X_C$, $X_D$, $X_E$, and $X_F$, the two-terminal pair circuit composed of, starting from the input side, $X_A$ present between two lines of the two-terminal pair circuit, $X_B$ present on one line thereof, $X_C$ present between the two lines, $X_D$ present on the one line, $X_E$ present between the two lines, and $X_F$ present on the one line, is set to satisfy the following relationship.

$$X_A = X_C = -X_B \wedge X_D = X_F = -X_E$$

In this case, the input impedance $Z_{in}$ is represented as $Z_{in} = (X_A^2/X_E^2) \cdot R$, and is proportional to the resistance value R of the load, and thus output voltage proportional to input voltage is obtained. It is noted that, in order to exert this function, the input voltage needs to be AC.

The transformer 200 using a lumped constant circuit as described above may be used in combination with a transformer having another configuration. The following are examples of such a transformer having another configuration.

<Transformer Using Switching by Reactance Element>

Figure 15:
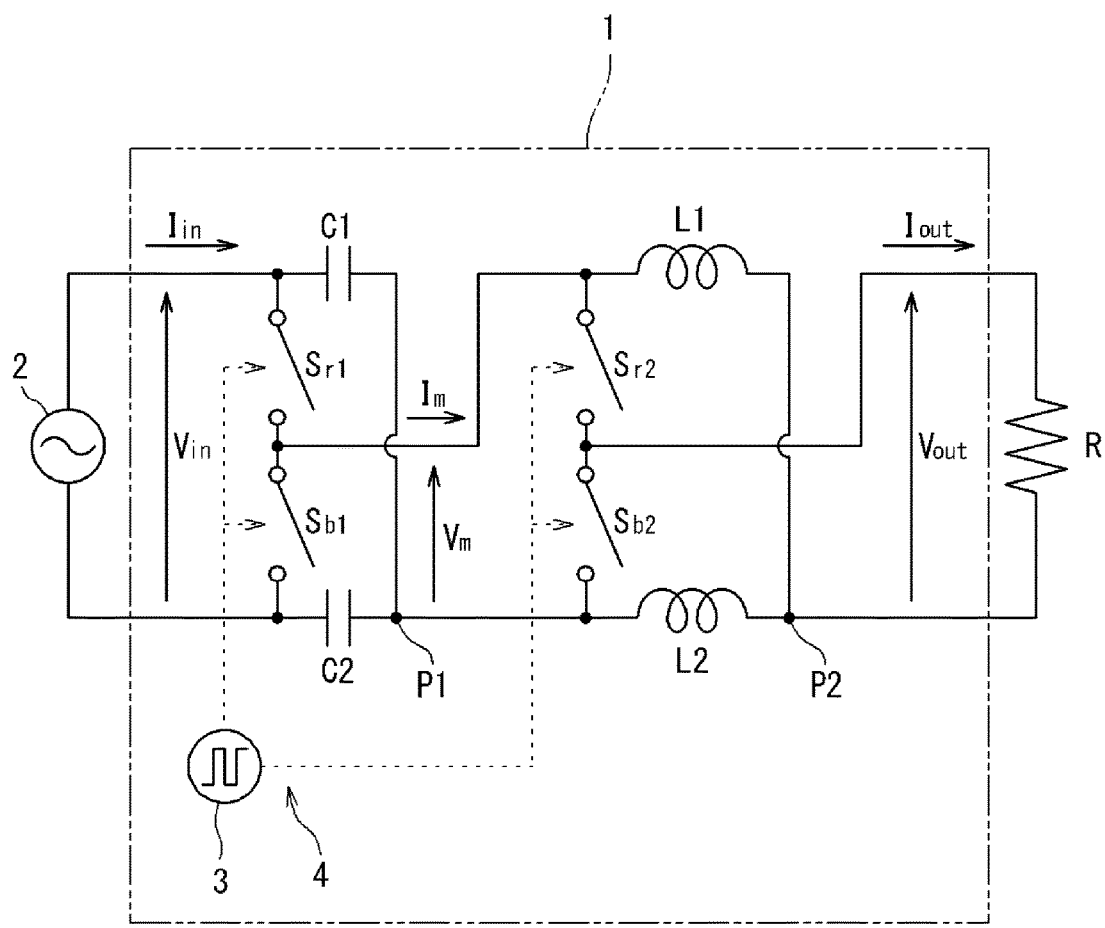
FIG. 15 is a circuit diagram showing a transformer having another configuration.

FIG. 15 is a circuit diagram showing an example of such a transformer 1. In FIG. 15, the transformer 1 is provided between an AC power supply 2 and a load R. The transformer 1 includes a pair of capacitors C1 and C2, a pair of inductors L1 and L2, four switches $S_{r1}$, $S_{r2}$, $S_{b1}$, and $S_{b2}$, and a switching control section 3 which performs ON/OFF control of the switches $S_{r1}$, $S_{r2}$, $S_{b1}$, and $S_{b2}$. A switching frequency of the switching control section 3 is, for example, about 1 MHz. The switching frequency is preferably equal to or higher than 1 MHz, but may be lower than 1 MHz.

The switches $S_{r1}$, $S_{r2}$, $S_{b1}$, and $S_{b2}$ and the switching control section 3 form a switch device 4 which switches the state of circuit connection of the transformer 1. The switches $S_{r1}$ and $S_{r2}$ operate in synchronization with each other, and the switches $S_{b1}$ and $S_{b2}$ operate in synchronization with each other. The pair of switches $S_{r1}$ and $S_{r2}$ and the pair of switches $S_{b1}$ and $S_{b2}$ operate so as to be alternately turned on exclusively from each other. The switches $S_{r1}$, $S_{r2}$, $S_{b1}$, and $S_{b2}$ are semiconductor switching elements formed by an SiC element or a GaN element, for example. An SiC element or a GaN element allows faster switching than an Si element, for example. In addition, sufficient withstand voltage (which can be even 6 kV per element, for example) can be obtained without connecting multiple stages of such elements.

In FIG. 15, the pair of capacitors C1 and C2 are connected in series to each other via a connection point P1. The AC power supply 2 is connected between both ends of this series unit. The input voltage $V_{in}$ is applied to the series unit of the pair of capacitors C1 and C2, so that input current $I_{in}$ flows.

The pair of inductors L1 and L2 are connected in series to each other via a connection point P2. Between both ends of this series unit, input voltage $V_m$ is applied via the capacitors C1 and C2, so that input current $I_m$ flows. When one of the switches $S_{r1}$ and $S_{b2}$ is ON, current flows in the load R. Here, voltage applied to the load R is $V_{out}$, and output current flowing from the transformer 1 to the load R is $I_{out}$.

Figure 16:
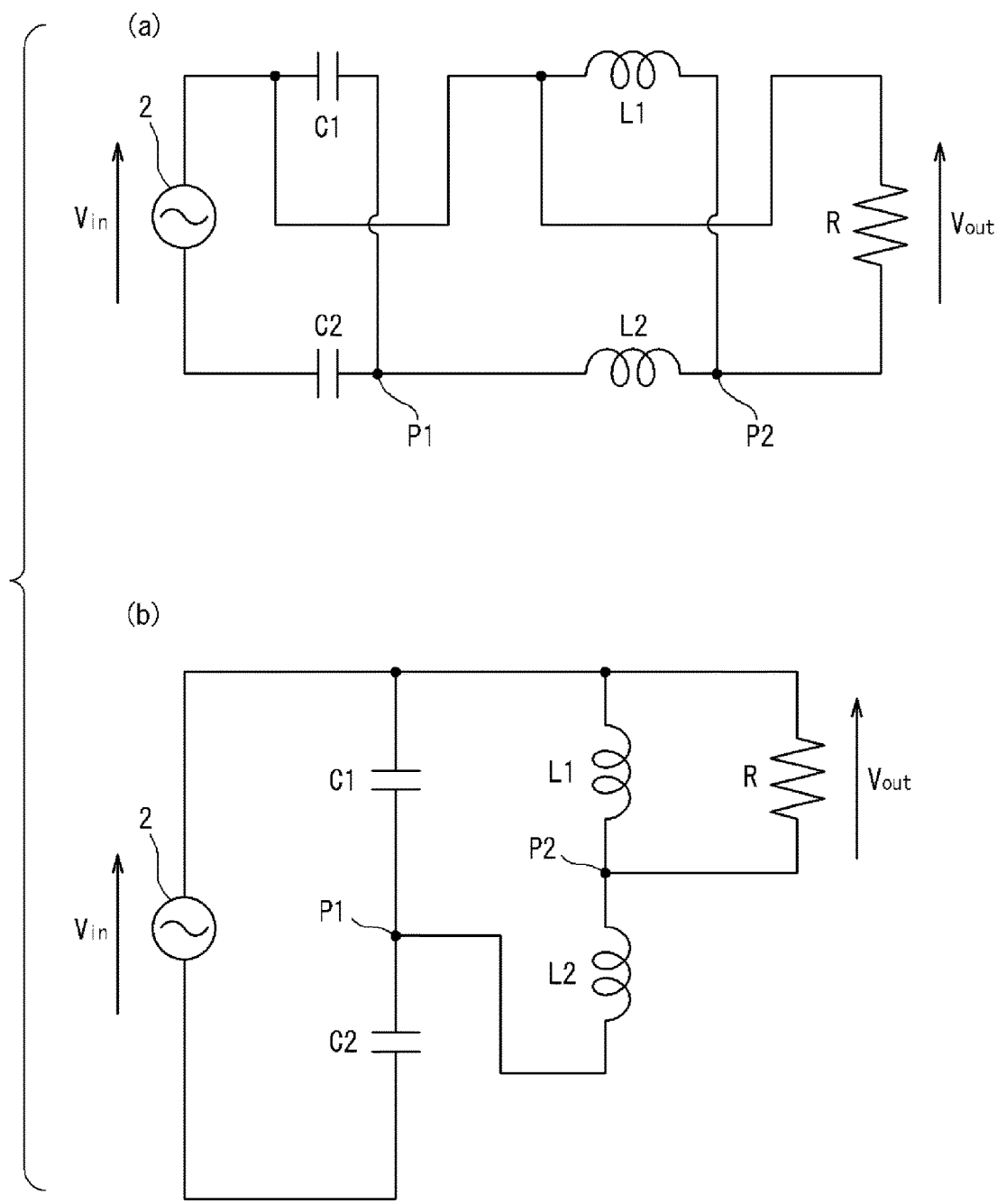
FIG. 16 is a circuit diagram in which (a) shows a substantial connection state when, of four switches in FIG. 15, two switches on the upper side are ON and two switches on the lower side are OFF, and (b) shows, in a step-like shape, the same circuit diagram as in (a).

In FIG. 16, (a) is a circuit diagram showing a substantial connection state when, of the four switches $S_{r1}$, $S_{r2}$, $S_{b1}$, and $S_{b2}$ in FIG. 15, the two switches $S_{r1}$ and $S_{r2}$ on the upper side are ON and the two switches $S_{b1}$ and $S_{b2}$ on the lower side are OFF. In the drawing, the switch device 4 in FIG. 15 is not shown. In FIG. 16, (b) is a circuit diagram showing, in a step-like shape, the same circuit diagram as in (a).

Figure 17:
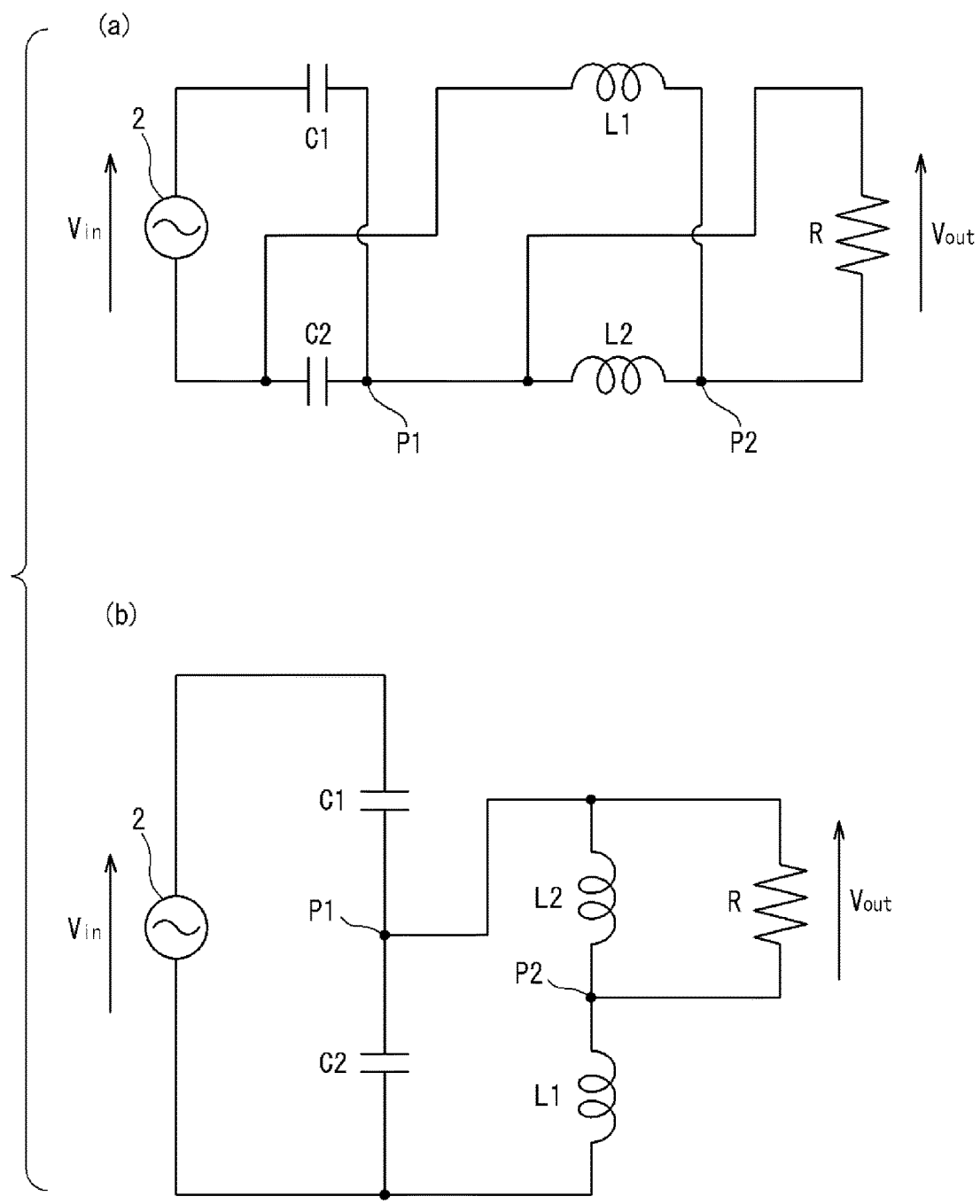
FIG. 17 is a circuit diagram in which (a) shows a substantial connection state when, of the four switches in FIG. 15, the two switches on the lower side are ON and the two switches on the upper side are OFF, and (b) shows, in a step-like shape, the same circuit diagram as in (a).

On the other hand, in FIG. 17, (a) is a circuit diagram showing a substantial connection state when, of the four switches $S_{r1}$, $S_{r2}$, $S_{b1}$, and $S_{b2}$ in FIG. 15, the two switches $S_{b1}$ and $S_{b2}$ on the lower side are ON and the two switches $S_{r1}$ and $S_{r2}$ on the upper side are OFF. In FIG. 17, (b) is a circuit diagram showing, in a step-like shape, the same circuit diagram as in (a).

While the states in FIG. 16 and FIG. 17 are alternately repeated, voltage obtained via the connection point P1 of the series unit of the capacitors C1 and C2 becomes voltage obtained via the connection point P2 of the series unit of the inductors L1 and L2. That is, transformation is performed from the capacitor side at the preceding stage to the inductor side at the subsequent stage. Here, it is estimated that the input voltage becomes about ¼ to be outputted. This has been confirmed by experiments by the inventors.

Figure 18:
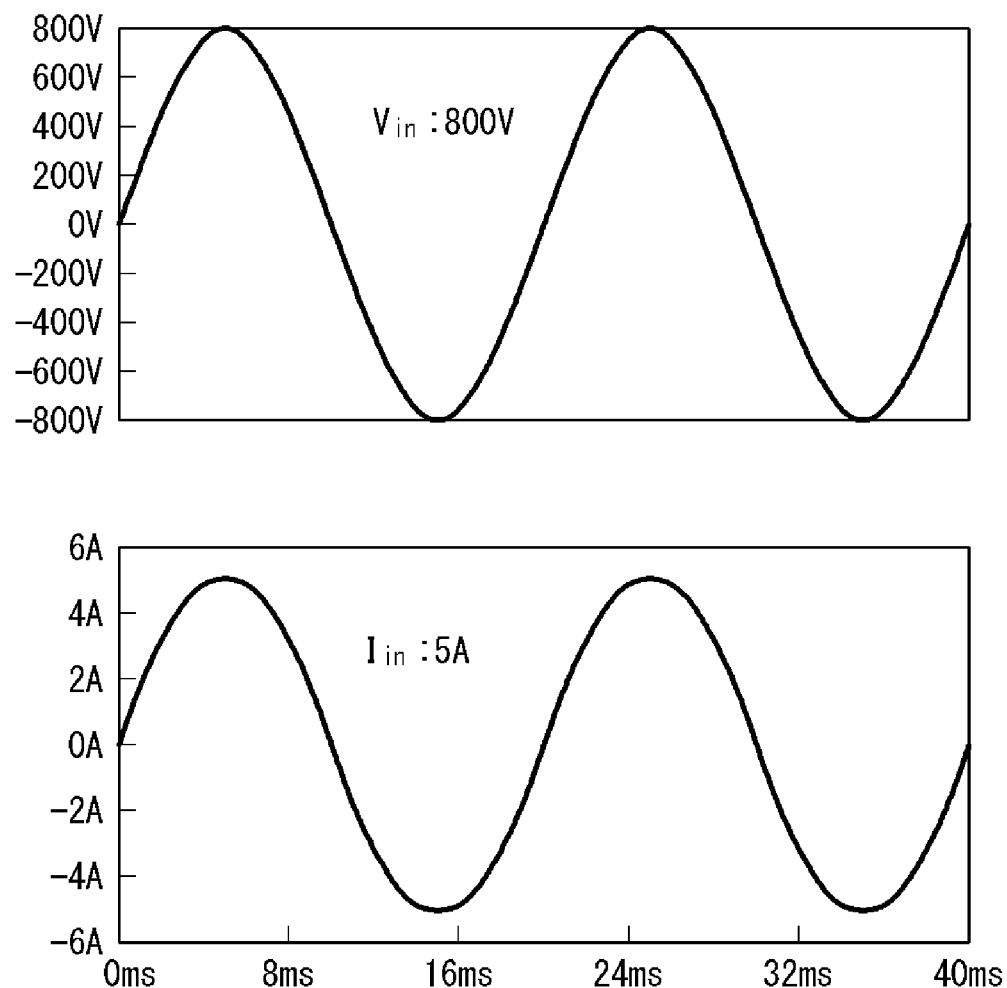
FIG. 18 is waveform diagrams respectively showing input voltage and input current to the transformer in FIG. 15.

FIG. 18 is waveform diagrams, the upper one showing the input voltage to the transformer 1, and the lower one showing the input current to the transformer 1.

Figure 19:
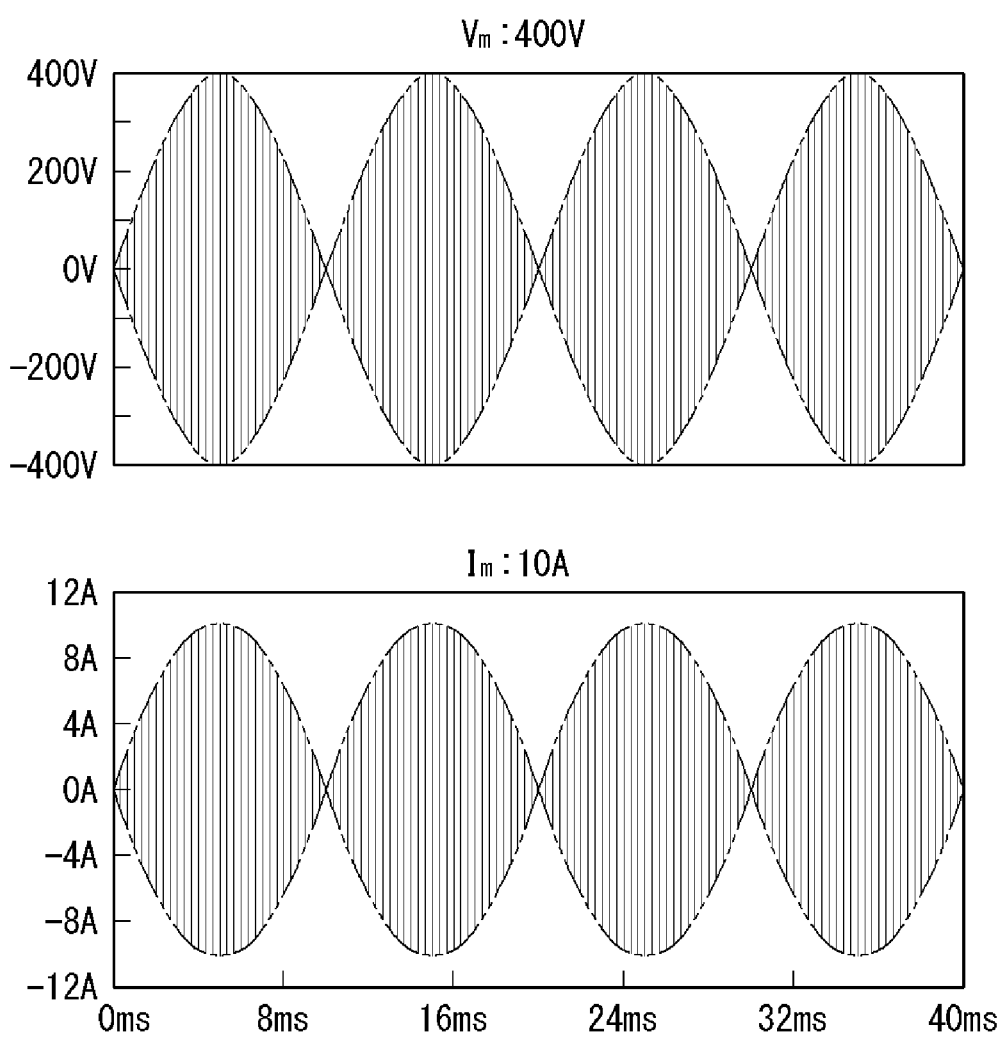
FIG. 19 is waveform diagrams respectively showing voltage and current at an intermediate stage of transformation in the transformer in FIG. 15.

FIG. 19 is waveform diagrams respectively showing the voltage $V_m$ and the current $I_m$ at an intermediate stage of transformation. Each waveform is actually formed by a pulse train based on switching, and as a whole, represented by the waveform as shown in FIG. 19.

Figure 20:
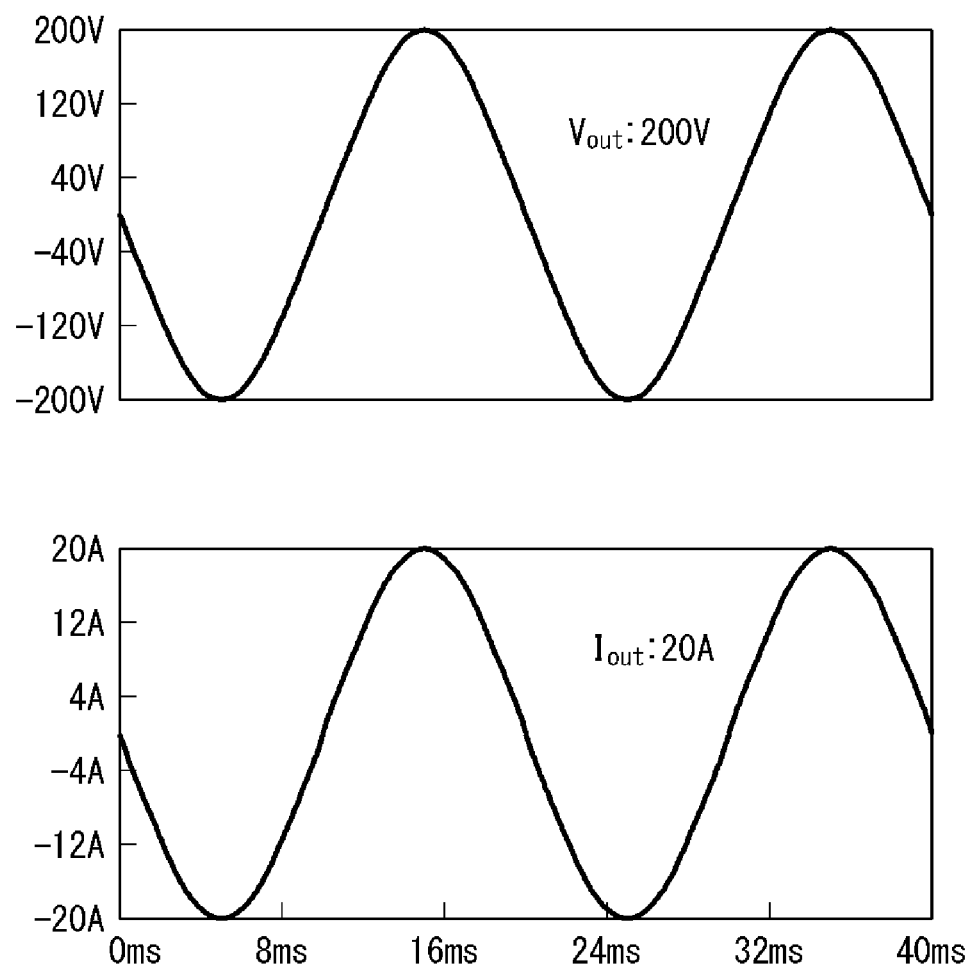
FIG. 20 is waveform diagrams respectively showing output voltage and output current from the transformer in FIG. 15.

FIG. 20 is waveform diagrams, the upper one showing the output voltage from the transformer 1, and the lower one showing the output current from the transformer 1. As is obvious from comparison between FIG. 18 and FIG. 20, the voltage is transformed to ¼, and along with this, the current quadruples.

Combination Examples

Figure 21:
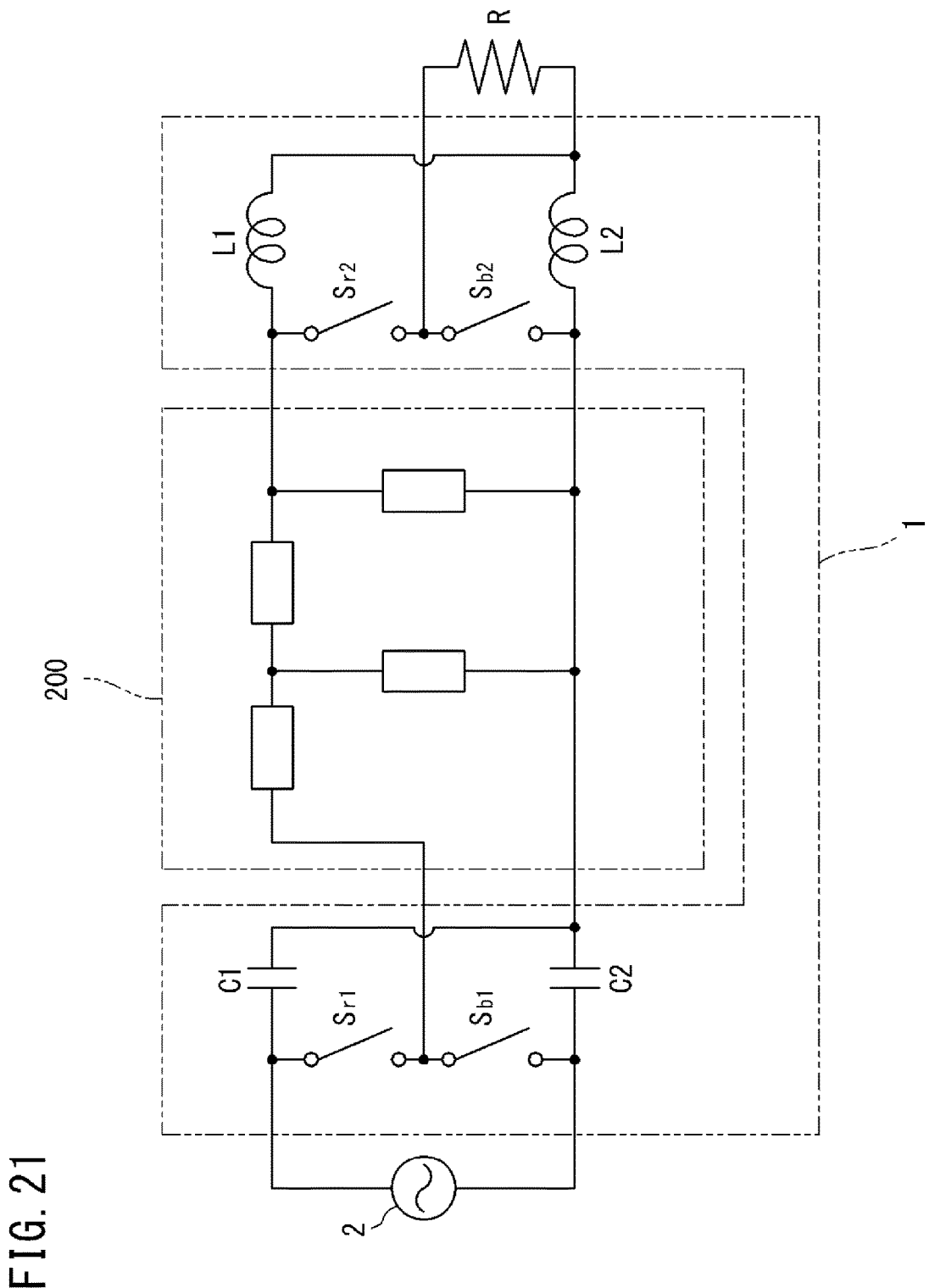
FIG. 21 is a circuit diagram showing a combination of the transformer shown in FIG. 15 and the transformer having the circuit configuration of 4A type.

FIG. 21 is a circuit diagram showing a combination of the transformer 1 shown in FIG. 15 and the transformer 200 having the circuit configuration of 4A type as described above. In FIG. 21, the transformer 200 is interposed between the capacitor stage and the inductor stage in the transformer 1 shown in FIG. 15. By thus combining transformation functions of the two kinds of transformers 1 and 200, it becomes possible to design the voltage transformation ratio in a wide range.

In this case, it is possible to utilize the transformer 200 having a lumped constant circuit, using an environment in which switching is performed at a high frequency of 1 MHz, for example. It is noted that, even if the AC power supply 2 is replaced with a DC power supply, a switching waveform based on switching at the preceding stage in the transformer 1 is inputted to the transformer 200, and therefore the transformer 200 can be used (hereafter, the same applies).

Figure 22:
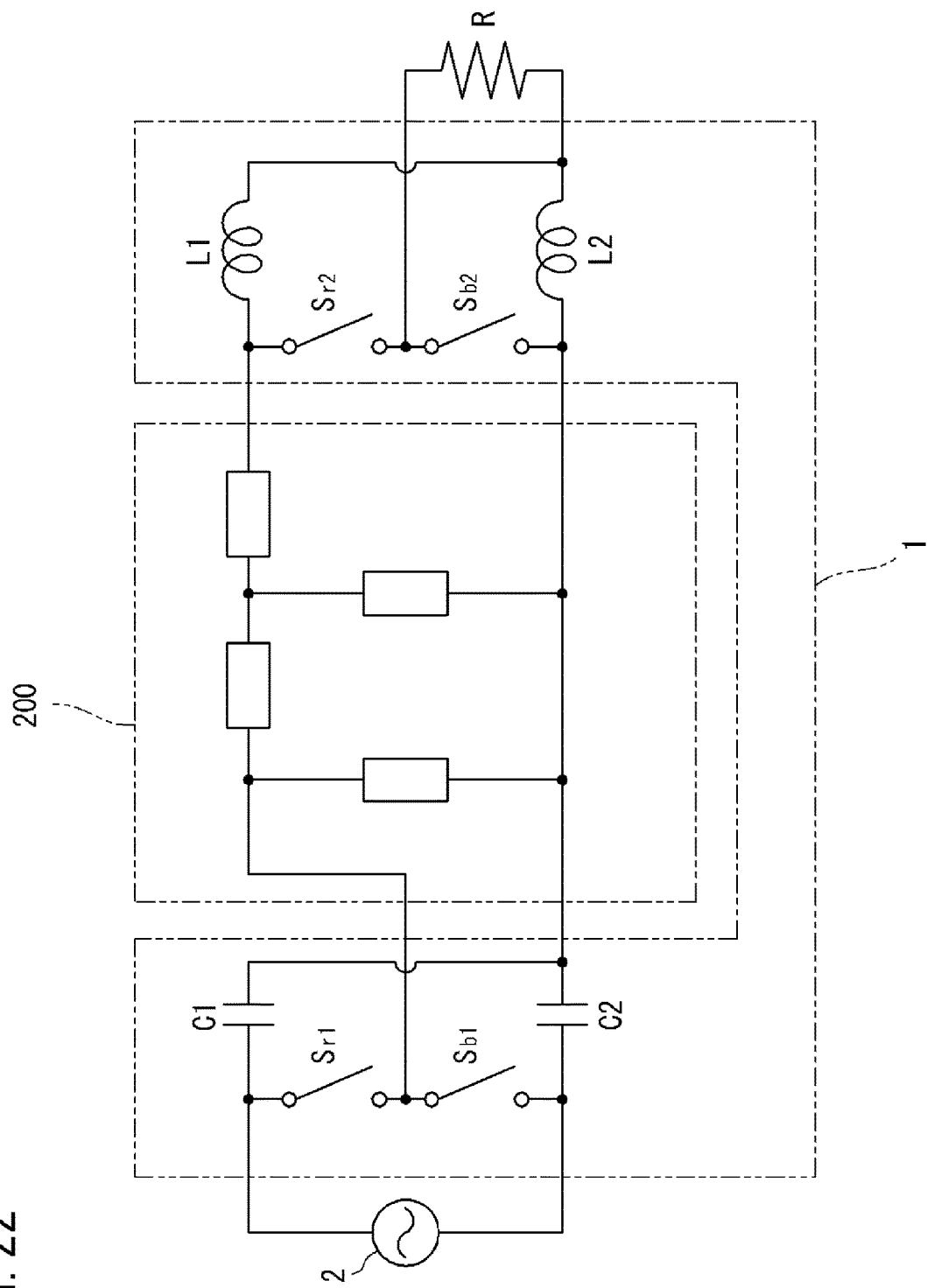
FIG. 22 is a circuit diagram showing a combination of the transformer shown in FIG. 15 and the transformer having the circuit configuration of 4B type.

FIG. 22 is a circuit diagram showing a combination of the transformer 1 shown in FIG. 15 and the transformer 200 having the circuit configuration of 4B type as described above. In FIG. 22, the transformer 200 is interposed between the capacitor stage and the inductor stage in the transformer 1 shown in FIG. 15. By thus combining transformation functions of the two kinds of transformers 1 and 200, it becomes possible to design the voltage transformation ratio in a wide range.

Figure 23:
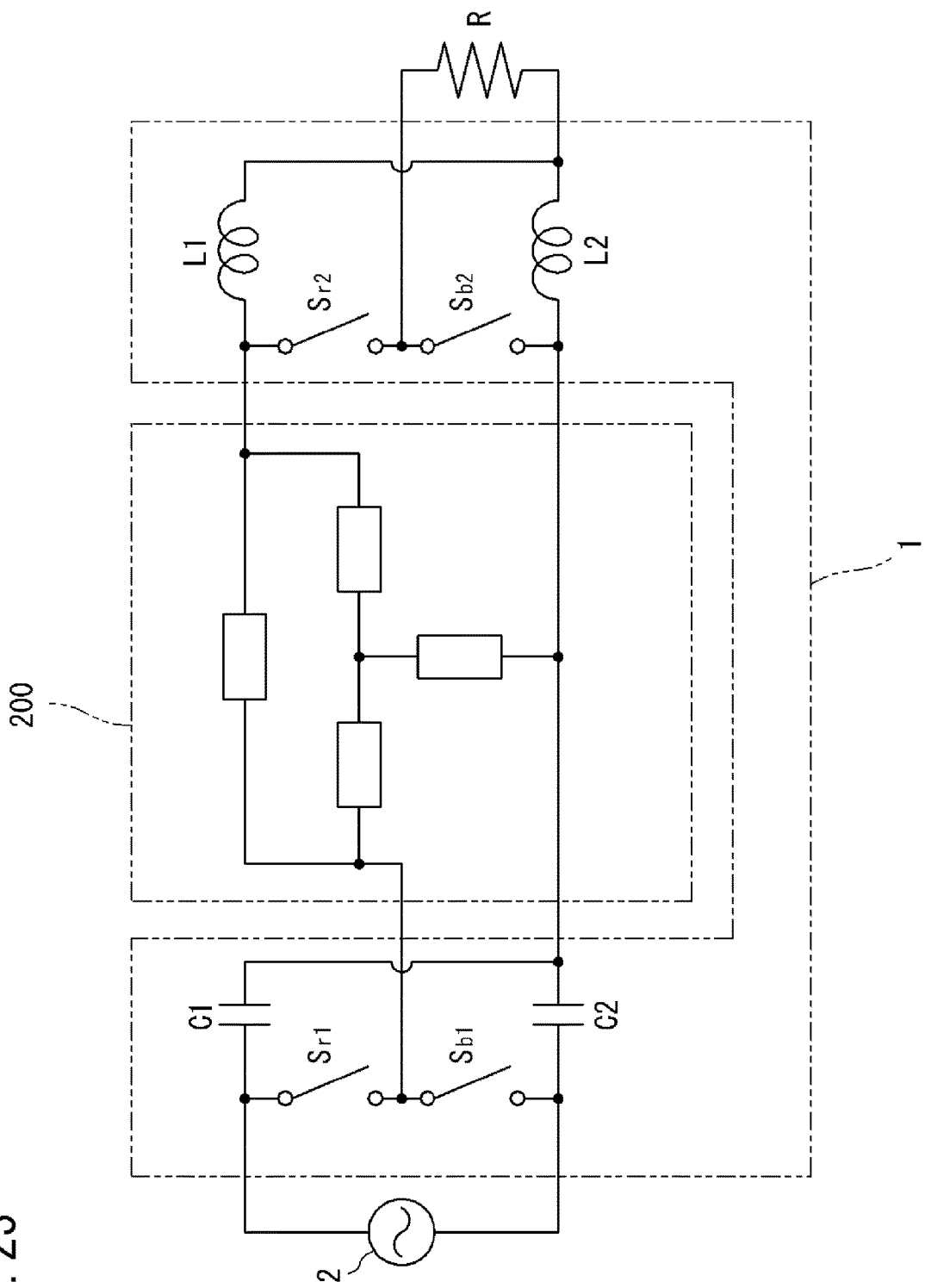
FIG. 23 is a circuit diagram showing a combination of the transformer shown in FIG. 15 and the transformer having the circuit configuration of 4C type.

FIG. 23 is a circuit diagram showing a combination of the transformer 1 shown in FIG. 15 and the transformer 200 having the circuit configuration of 4C type as described above. In FIG. 23, the transformer 200 is interposed between the capacitor stage and the inductor stage in the transformer 1 shown in FIG. 15. By thus combining transformation functions of the two kinds of transformers 1 and 200, it becomes possible to design the voltage transformation ratio in a wide range.

Figure 24:
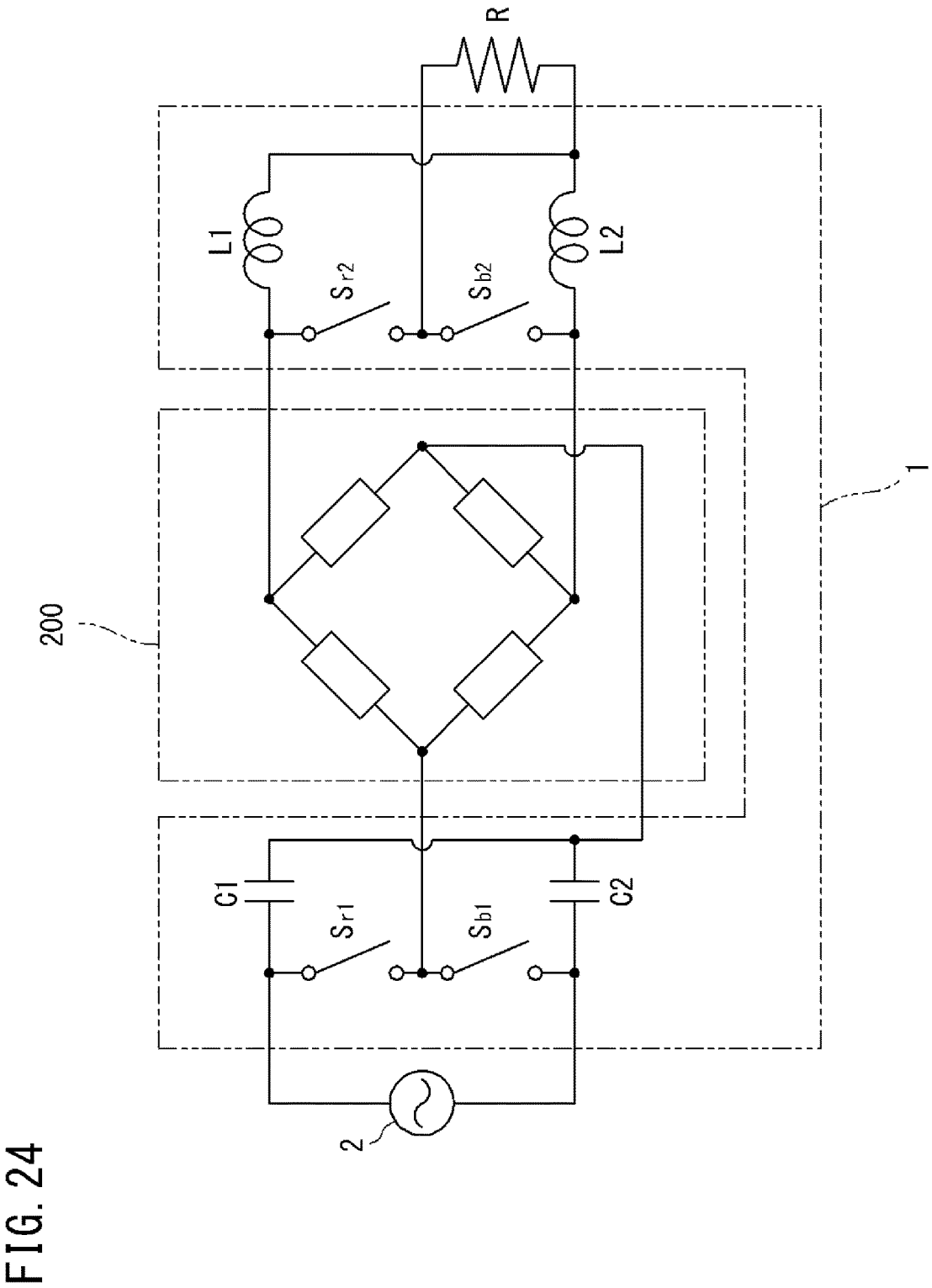
FIG. 24 is a circuit diagram showing a combination of the transformer shown in FIG. 15 and the transformer having the circuit configuration of 4D type.

FIG. 24 is a circuit diagram showing a combination of the transformer 1 shown in FIG. 15 and the transformer 200 having the circuit configuration of 4D type as described above. In FIG. 24, the transformer 200 is interposed between the capacitor stage and the inductor stage in the transformer 1 shown in FIG. 15. By thus combining transformation functions of the two kinds of transformers 1 and 200, it becomes possible to design the voltage transformation ratio in a wide range.

<<Others>>

As the above reactance elements, a capacitance of a cable and an inductance of a cable may be used.

In this case, there is an advantage that the cable can easily ensure voltage withstanding performance and the cost thereof is low.

It is noted that the embodiments disclosed herein are merely illustrative in all aspects and should not be recognized as being restrictive. The scope of the present invention is defined by the scope of the claims, and is intended to include meaning equivalent to the scope of the claims and all modifications within the scope.

REFERENCE SIGNS LIST 1 transformer
2 AC power supply
3 switching control section
4 switch device
200 transformer
C1, C2 capacitor
L1, L2 inductor
$S_{b1}$, $S_{b2}$ switch
$S_{r1}$, $S_{r2}$ switch
P1, P2 connection point
R load

The invention claimed is:

1. A transformer provided between a power supply, and a load with a resistance value R, the transformer comprising:
a two-terminal pair circuit composed of n-number of reactance elements that are mutually connected, where n is a natural number equal to or greater than 4,
wherein, with respect to any value of the resistance value R of the load, an input impedance $Z_{in}$ of the two-terminal pair circuit has a real number component of k·R, where k is a constant, and an imaginary number component of 0,
wherein, in the case where reactances of four reactance elements are $X_1$, $X_2$, $X_3$, and $X_4$, the two-terminal pair circuit is composed of, starting from an input side, $X_1$ present on one line of the two-terminal pair circuit, $X_2$ present between two lines thereof, $X_3$ present on the one line, and $X_4$ present between the two lines, and the following condition is satisfied:

$(1/X_1)+(1/X_2)+(1/X_3)=0 \wedge X_2+X_3+X_4=0$.

2. A transformer provided between a power supply, and a load with a resistance value R, the transformer comprising:
a two-terminal pair circuit composed of n-number of reactance elements that are mutually connected, where n is a natural number equal to or greater than 4,
wherein, with respect to any value of the resistance value R of the load, an input impedance $Z_{in}$ of the two-terminal pair circuit has a real number component of k·R, where k is a constant, and an imaginary number component of 0,
wherein, in the case where reactances of four reactance elements are $X_1$, $X_2$, $X_3$, and $X_4$, the two-terminal pair circuit is composed of, starting from an input side, $X_1$ present between two lines of the two-terminal pair circuit, $X_2$ present on one line thereof, $X_3$ present between the two lines, and $X_4$ present on the one line, and the following condition is satisfied:

$X_1+X_2+X_3=0 \wedge (1/X_2)+(1/X_3)+(1/X_4)=0$.

3. A transformer provided between a power supply, and a load with a resistance value R, the transformer comprising:
a two-terminal pair circuit composed of n-number of reactance elements that are mutually connected, where n is a natural number equal to or greater than 4,
wherein, with respect to any value of the resistance value R of the load, an input impedance $Z_{in}$ of the two-terminal pair circuit has a real number component of k·R, where k is a constant, and an imaginary number component of 0,
wherein, in the case where reactances of four reactance elements are $X_1$, $X_2$, $X_3$, and $X_4$, the two-terminal pair circuit is composed of: starting from an input side, a T-shaped circuit formed by $X_1$ present on one line of the two-terminal pair circuit, $X_2$ present between two lines thereof, and $X_3$ present on the one line; and $X_4$ present in parallel with a series unit of $X_1$ and $X_3$, and the following condition is satisfied:

$X_1+X_3+X_4=0 \wedge (1/X_1)+(1/X_2)+(1/X_3)=0$.

4. A transformer provided between a power supply, and a load with a resistance value R, the transformer comprising:
a two-terminal pair circuit composed of n-number of reactance elements that are mutually connected, where n is a natural number equal to or greater than 4,
wherein, with respect to any value of the resistance value R of the load, an input impedance $Z_{in}$ of the two-terminal pair circuit has a real number component of k·R, where k is a constant, and an imaginary number component of 0,
wherein, in the case where reactances of four reactance elements are $X_1$, $X_2$, $X_3$, and $X_4$, the two-terminal pair circuit is composed of, starting from an input side, a first series unit of $X_1$ and $X_2$ present between two lines of the two-terminal pair circuit, and a second series unit of $X_3$ and $X_4$ present between the two lines, such that a mutual connection point in the first series unit and a mutual connection point in the second series unit are output terminals, and the following condition is satisfied:

$X_1+X_2+X_3+X_4=0 \wedge (1/X_1)+(1/X_2)+(1/X_3)+(1/X_4)=0$.

5. A transformer provided between a power supply, and a load with a resistance value R, the transformer comprising:
a two-terminal pair circuit composed of n-number of reactance elements that are mutually connected, where n is a natural number equal to or greater than 4,
wherein, with respect to any value of the resistance value R of the load, an input impedance $Z_{in}$ of the two-terminal pair circuit has a real number component of k·R, where k is a constant, and an imaginary number component of 0,
wherein, in the case where reactances of five reactance elements are $X_A$, $X_B$, $X_C$, $X_D$, and $X_E$, the two-terminal pair circuit is composed of, starting from an input side, $X_A$ present on one line of the two-terminal pair circuit, $X_B$ present between two lines thereof, $X_C$ present on the one line, $X_D$ present between the two lines, and $X_E$ present on the one line, and the following relationship is satisfied:

$X_A=-X_B \wedge X_E=-X_D \wedge X_C=X_A+X_E$.

6. A transformer provided between a power supply, and a load with a resistance value R, the transformer comprising:
a two-terminal pair circuit composed of n-number of reactance elements that are mutually connected, where n is a natural number equal to or greater than 4,
wherein, with respect to any value of the resistance value R of the load, an input impedance $Z_{in}$ of the two-terminal pair circuit has a real number component of k·R, where k is a constant, and an imaginary number component of 0,
wherein, in the case where reactances of five reactance elements are $X_A$, $X_B$, $X_C$, $X_D$, and $X_E$, the two-terminal pair circuit is composed of, starting from an input side, $X_A$ present between two lines of the two-terminal pair circuit, $X_B$ present on one line thereof, $X_C$ present between the two lines, $X_D$ present on the one line, and $X_E$ present between the two lines, and the following relationship is satisfied:

$X_A=-X_B \wedge X_E=-X_D \wedge X_C=X_A \cdot X_E/(X_A+X_E)$.

7. A transformer provided between a power supply, and a load with a resistance value R, the transformer comprising:
- a two-terminal pair circuit composed of n-number of reactance elements that are mutually connected, where n is a natural number equal to or greater than 4,
- wherein, with respect to any value of the resistance value R of the load, an input impedance $Z_{in}$ of the two-terminal pair circuit has a real number component of k·R, where k is a constant, and an imaginary number component of 0,
- wherein, in the case where reactances of six reactance elements are $X_A$, $X_B$, $X_C$, $X_D$, $X_E$, and $X_F$, the two-terminal pair circuit is composed of, starting from an input side, $X_A$ present on one line of the two-terminal pair circuit, $X_B$ present between two lines thereof, $X_C$ present on the one line, $X_D$ present between the two lines, $X_E$ present on the one line, and $X_F$ present between the two lines, and the following relationship is satisfied:

$$X_A = X_C = -X_B \wedge X_D = X_F = -X_E.$$

8. A transformer provided between a power supply, and a load with a resistance value R, the transformer comprising:
- a two-terminal pair circuit composed of n-number of reactance elements that are mutually connected, where n is a natural number equal to or greater than 4,
- wherein, with respect to any value of the resistance value R of the load, an input impedance $Z_{in}$ of the two-terminal pair circuit has a real number component of k·R, where k is a constant, and an imaginary number component of 0,
- wherein, in the case where reactances of six reactance elements are $X_A$, $X_B$, $X_C$, $X_D$, $X_E$, and $X_F$, the two-terminal pair circuit is composed of, starting from an input side, $X_A$ present between two lines of the two-terminal pair circuit, $X_B$ present on one line thereof, $X_C$ present between the two lines, $X_D$ present on the one line, $X_E$ present between the two lines, and $X_F$ present on the one line, and the following relationship is satisfied:

$$X_A = X_C = -X_B \wedge X_D = X_F = -X_E.$$

\* \* \* \* \*